(12) United States Patent  (10) Patent No.: US 8,822,039 B2
Ono et al.  (45) Date of Patent: Sep. 2, 2014

(54) CHARGE-TRANSPORTING VARNISH AND ORGANIC ELECTRO-LUMINESCENT DEVICES MADE BY USING THE SAME

(75) Inventors: Go Ono, Funabashi (JP); Taku Kato, Funabashi (JP); Shinichi Maeda, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 1176 days.

(21) Appl. No.: 10/593,772

(22) PCT Filed: Mar. 24, 2005

(86) PCT No.: PCT/JP2005/005347
§ 371 (c)(1),
(2), (4) Date: Sep. 22, 2006

(87) PCT Pub. No.: WO2005/092984
PCT Pub. Date: Oct. 6, 2005

(65) Prior Publication Data
US 2007/0187672 A1  Aug. 16, 2007

(30) Foreign Application Priority Data

Mar. 25, 2004 (JP) ................................ 2004-088725

(51) Int. Cl.
*H01L 51/54* (2006.01)
(52) U.S. Cl.
USPC ........... 428/690; 428/917; 313/504; 313/505; 313/506; 257/40; 257/E51.05; 257/E51.026; 257/E51.032; 252/500; 252/519.3; 252/519.33

(58) Field of Classification Search
USPC ................. 428/690, 917; 313/504, 505, 506; 257/40, E51.05, E51.026, E51.032; 544/234; 252/500, 519.3, 519.33
See application file for complete search history.

(56) References Cited

U.S. PATENT DOCUMENTS

| 4,851,487 A | 7/1989 | Yaniger et al. |
| 4,855,361 A | 8/1989 | Yaniger et al. |

(Continued)

FOREIGN PATENT DOCUMENTS

| EP | 0528178 A2 | 2/1993 |
| EP | 1248497 A1 | 10/2002 |

(Continued)

OTHER PUBLICATIONS

Nalwa, Structural determination of semiconductive . . . J of Material Science, 26 (1991) p. 1683-1690.*

(Continued)

*Primary Examiner* — Gregory Clark
(74) *Attorney, Agent, or Firm* — Birch, Stewart, Kolasch & Birch, LLP

(57) ABSTRACT

A charge-transporting varnish containing either a charge-transporting substance consisting of a charge-transporting oligoaniline or a charge-transporting organic material consisting of the charge-transporting substance and a charge-accepting dopant and at least one polymer selected from among polyimides and polyimide precursors; and charge-transporting thin films and organic EL devices, made by using the varnish. The varnish can give thin films which little suffer from defects and have high uniformity and flatness and excellent mechanical strengths, heat resistance, and transparency. In particular, the varnish realizes excellent EL characteristics such as low driving voltage, high emission efficiency, and long service life, when used in organic EL devices.

10 Claims, 3 Drawing Sheets

(56) References Cited

U.S. PATENT DOCUMENTS

| | | | |
|---|---|---|---|
| 4,983,690 | A | 1/1991 | Cameron et al. |
| 5,095,076 | A | 3/1992 | Clement et al. |
| 6,149,840 | A | 11/2000 | Ardakani et al. |
| 6,337,404 | B1 | 1/2002 | Han et al. |
| 6,632,544 | B1 * | 10/2003 | Kido et al. .............. 428/690 |
| 2002/0098378 | A1 | 7/2002 | Kim et al. |
| 2002/0132133 | A1 | 9/2002 | Kim et al. |
| 2003/0097003 | A1 | 5/2003 | Lindsay et al. |
| 2003/0105270 | A1 | 6/2003 | Lindsay et al. |
| 2004/0167314 | A1 | 8/2004 | Yamada et al. |
| 2005/0082514 | A1 | 4/2005 | Yoshimoto et al. |

FOREIGN PATENT DOCUMENTS

| | | | | |
|---|---|---|---|---|
| EP | 1 403 325 | A1 | 3/2004 | |
| EP | 1 477 993 | A1 | 11/2004 | |
| EP | 1 728 827 | A1 | 12/2006 | |
| JP | 6-338392 | A | 12/1994 | |
| JP | 07-090179 | * | 4/1995 | ............. C08J 5/00 |
| JP | 7-90179 | A | 4/1995 | |
| JP | 8-143664 | A | 6/1996 | |
| JP | 8-259810 | A | 10/1996 | |
| JP | 10-308280 | A | 11/1998 | |
| JP | 11-116676 | A | 4/1999 | |
| JP | 11-135262 | A | 5/1999 | |
| JP | 11-185962 | A | 7/1999 | |
| JP | 11-199864 | A | 7/1999 | |
| JP | 11-185962 | * | 9/1999 | ............. C09K 11/06 |
| JP | 2000-44683 | A | 2/2000 | |
| JP | 2001-023778 | * | 1/2001 | ............. H05B 33/14 |
| JP | 2001-23778 | A | 1/2001 | |
| JP | 2001-247525 | A | 9/2001 | |
| JP | 2003-77668 | A | 3/2003 | |
| JP | 2003-226765 | A | 8/2003 | |
| JP | 2004-2740 | A | 1/2004 | |
| JP | 2005-41915 | A | 2/2005 | |
| JP | 2005-75948 | A | 3/2005 | |
| JP | 2005-93427 | A | 4/2005 | |
| JP | 2005-93428 | A | 4/2005 | |
| JP | 2005-108828 | A | 4/2005 | |
| WO | WO 90/11317 | * | 10/1990 | ............. C08J 7/14 |
| WO | WO 90/11317 | A1 | 10/1990 | |
| WO | WO-02/100949 | A1 | 12/2002 | |
| WO | WO-03/071559 | A1 | 8/2003 | |
| WO | WO 2005/092984 | A1 | 10/2005 | |

OTHER PUBLICATIONS

Applied Physics Letters, 1987, vol. 51, pp. 913-915.
Applied Physics Letters, 1996, vol. 69, pp. 2160-2162.
Nature, 1992, vol. 357, pp. 477-479.
Applied Physics Letters, 1994, vol. 64, pp. 1245-1247.
Applied Physics Letters, 1998, vol. 72, pp. 2660-2662.
Bulletin of Chemical Society of Japan, 1994, vol. 67, pp. 1749-1752.
Synthetic Metals, 1997, vol. 84, pp. 119-120.
Kotov et al., "Photogeneration and photovoltaic properties of polyimides with extended charge delocalisation in polymer chains", Synthetic Metals, vol. 121, No. 1-3, pp. 1553-1554, Mar. 15, 2001.
Liou et al., "Synthesis and Properties of New Aromatic Poly(amine-imide)s Derived from N,N'-Bis(4-aminophenyl)-N,N'-diphenyl-1,4-phenylenediamine", Journal of Polymer Science, vol. 40, No. 21, pp. 3815-3822, Nov. 1, 2002.
Min, G., "Conducting Polymers and Their Applications in the Film Industry—Polyaniline/Polyimide Blended Films", Synthetic Metals, vol. 102, No. 1-3, pp. 1163-1166, 1999.
Supplementary European Search Report mailed Jan. 7, 2010 for application No. 05727092.
International Search Report mailed Sep. 5, 2006.
Non-Final Office Action mailed Apr. 22, 2010 in Co-Pending U.S. Appl. No. 11/921,419.
International Search Report, dated Jun. 14, 2005, for International Application No. PCT/JP2005/005347.
U.S. Office Action, dated Sep. 29, 2010, for copending U.S. Appl. No. 11/921,419.
Supplementary European Search Report dated Jul. 5, 2011.
U.S. Office Action, dated Dec. 13, 2011, for copending U.S. Appl. No. 11/921,419.

* cited by examiner

CHARGE-TRANSPORTING VARNISH AND ORGANIC ELECTRO-LUMINESCENT DEVICES MADE BY USING THE SAME

TECHNICAL FIELD

This invention relates to a charge transporting varnish, and a charge transporting thin film and an organic electroluminescent (hereinafter abbreviated as EL) device using the same.

BACKGROUND ART

Organic EL devices have been intensively studied since Eastman Kodak Company found an organic EL device (see, for example, Non-patent Document 1) that shows a characteristic of about 1000 cd/m$^2$ at a drive voltage of 10 V or below. Organic EL devices can be broadly classified into low molecular weight organic EL (hereinafter abbreviated as OLED) and EL using polymer light-emitting materials (hereinafter abbreviated as PLED). In either case, in order to improve initial characteristics such as a low drive voltage and a high emission efficiency and also ensure a prolonged life of the device, the usual practice is to use a hole injection layer or a hole transport layer.

However, CuPC that is an ordinary hole injection material in OLED (see, for example, Non-patent Document 2) is insoluble in a diversity of solvents, so that vacuum deposition is necessary for film formation. For this reason, the resulting film has a drawback in that the film are greatly irregular and that if other organic layer is incorporated with the material in a very small amount, characteristic properties greatly lower, coupled with another problem that this material cannot be used as a hole transport layer of PLED. In addition, it has been reported that CuPC has an absorption in a visible range and is thus low in transparency, influencing the color tone of light from the device.

On the other hand, polyaniline materials (see, for example, Non-patent Documents 3, 4) and polythiophene materials (see, for example, Non-patent Documents 5) used as a hole transport layer of PLED are low in solubility in organic solvents. Eventually, the thin film obtained from a varnish containing these materials is in conveniently brittle and small in mechanical strength, with its heat resistance being poor. When a solvent is removed, powder is liable to be formed, with the problem involved in the uniformity and flatness of the thin film. This powder formation promotes the occurrence of dark spots and the lowering of device characteristics resulting from the short-circuiting between an anode and a cathode, and causes a yield to be lowered at the stage of producing an organic EL device.

Mixed materials of polyimides with polyaniline materials have been reported so as to improve the mechanical strength and heat resistance of a charge transporting thin film (see, for example, Patent Document 1). In this case, for enhancing charge transportability of the thin film, it is needed to increase a ratio of polyaniline in the mixture. However, if the content of the polyaniline is increased, powder is apt to be formed due to the low solubility thereof, with the attendant problem that a uniform and flat thin film cannot be obtained.

Hence, the problems on the mechanical strength, heat resistance, uniformity and flatness of the charge transporting thin film have never been solved yet satisfactorily.

For organic EL devices, there is a demand of developing such a device that has a high emission efficiency at low drive voltage and is good in economy. To this end, the charge transporting thin film should have, aside from excellent charge transportability, high transparency so as to improve the emission efficiency of the device.

Non-patent Document 1:
Applied Physics Letters, U.S.A. 1987, Vol. 51, pp. 913 to 915
Non-patent Document 2:
Applied Physics Letters, U.S.A. 1996, Vol. 69, pp. 2160 to 2162
Non-patent Document 3:
Nature, U.K. 1992, Vol. 357, pp. 477 to 479
Non-patent Document 4:
Applied Physics Letters, U.S.A. 1994, Vol. 64, pp. 1245 to 1247
Non-patent Document 5:
Applied Physics Letters, U.S.A. 1998, Vol. 72, pp. 2660 to 2662
Patent Document 1:
JP-A 11-185962

DISCLOSURE OF INVENTION

Problems to be Solved by the Invention

The invention has been made under these circumstances, and has for its object to provide a charge transporting varnish capable of forming a thin film whose defects are very small in number and which is high in uniformity and flatness and excellent in mechanical strength, heat resistance and transparency and also capable of realizing excellent EL characteristics such as a low drive voltage, high emission efficiency, prolonged life and the like when used as an organic EL device, and also to provide a charge transporting thin film and an organic EL device, each using the same.

Means for Solving the Problems

In order to achieve the above object, the present investors made intensive studies and, as a result, found that when using a varnish that contains a charge transporting substance made of a charge transporting oligoaniline having a given number average molecular weight or a charge transporting organic material made of the just-mentioned charge transporting substance and a charge accepting dopant substance, and at least one polymer selected from polyimides and polyimide precursors, it is possible to form a thin film, which is high in uniformity and flatness and excellent in mechanical strength, heat resistance and transparency and that this thin film is suited as a charge transporting thin film for organic EL devices. Based on this finding, the invention has been accomplished.

More particularly, the invention provides the following inventions [1] to [11].

[1] A charge transporting varnish, characterized by including a charge transporting substance made of a charge transporting oligoaniline having a number average molecular weight of 250 to 5000 or a charge transporting organic material made of the charge transporting substance and a charge accepting dopant substance, and at least one polymer selected from polyimides and polyimide precursors, the charge transporting substance or charge transporting organic material and the polymer being dissolved or dispersed in at least one solvent.

[2] The charge transporting varnish of [1], wherein the charge transporting substance is made of an oligoaniline derivative represented by the general formula (1) or a quinonediimine derivative that is an oxidized product of the general formula (1)

[Chemical Formula 1]

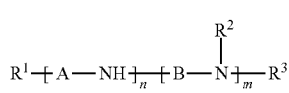

(1)

[wherein $R^1$, $R^2$ and $R^3$ independently represent hydrogen, a monovalent hydrocarbon group or an organoxy group, A and B independently represent a divalent group represented by the general formula (2) or (3)

[Chemical Formula 2]

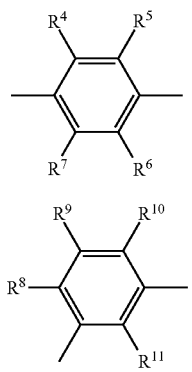

(2)

(3)

(wherein $R^4$ to $R^{11}$ independently represent hydrogen, a hydroxyl group, a monovalent hydrocarbon group, an organoxy group, an acyl group or a sulfone group, and m and n are independently an integer of 1 or over, and is such that m+n≤20 is satisfied)].

[3] The charge transporting varnish of [2], wherein the charge transporting substance is made of an oligoaniline derivative represented by the general formula (4) or a quinonediimine derivative that is an oxidized product of the general formula (4)

[Chemical Formula 3]

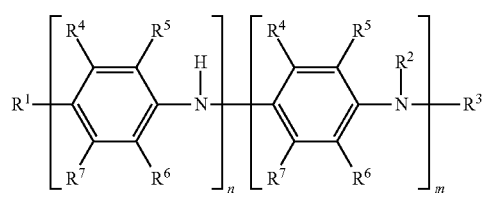

(4)

(wherein $R^1$ to $R^7$, m and n, respectively, have the same meanings as defined above).

[4] The charge transporting varnish of [3], wherein m and n is such that m+n≤6 is satisfied.

[5] The charge transporting varnish of any one of [1] to [4], wherein the polymer is contained in 0.1 to 50 wt % based on the total weight of solids in the charge transporting varnish.

[6] The charge transporting varnish of any one of [1] to [5], wherein the polymer is made of a polyimide or polyimide precursor having a number average molecular weight of 1000 to 50000.

[7] The charge transporting varnish of any one of [1] to [6], wherein the polymer is made of a polyimide precursor represented by the general formula (5), or a polyimide obtained by dehydration ring closure of the polyimide precursor

[Chemical Formula 4]

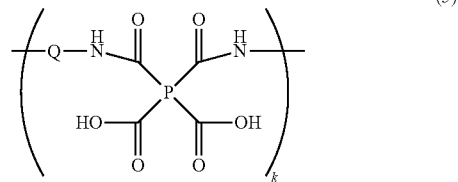

(5)

{wherein P is at least one tetravalent organic group selected from those of the general formulas (6) to (12)

[Chemical Formula 5]

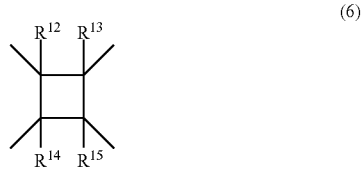

(6)

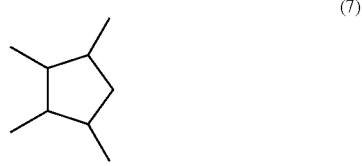

(7)

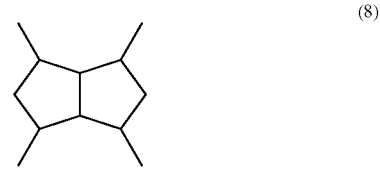

(8)

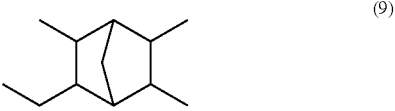

(9)

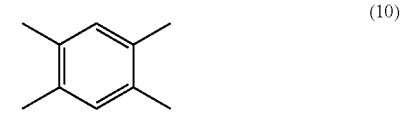

(10)

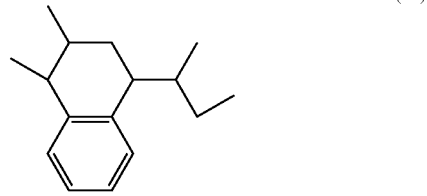

(11)

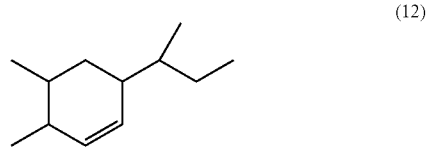

(12)

[in the formula (6), $R^{12}$ to $R^{15}$ independently represent hydrogen, fluorine, an alkyl group that has 1 to 5 carbon atoms and may have a branched structure, or an alkoxy group that has 1 to 5 carbon atoms and may have a branched structure], Q is at least one divalent organic group selected from those of the general formulas (13) to (19)

[Chemical Formula 6]

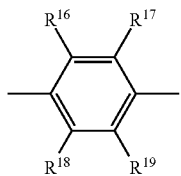 (13)

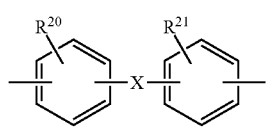 (14)

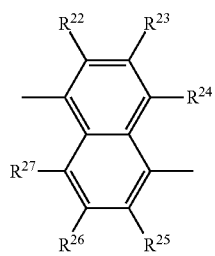 (15)

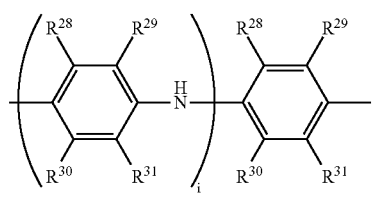 (16)

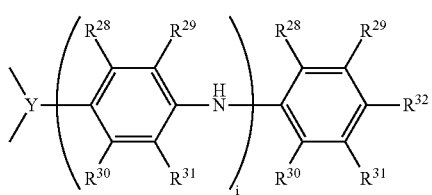 (17)

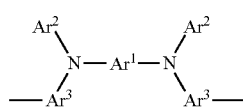 (18)

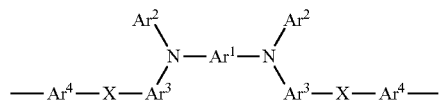 (19)

[wherein $R^{16}$ to $R^{32}$ independently represent hydrogen, fluorine, an alkyl group that has 1 to 5 carbon atoms and may have a branched structure, or an alkoxy group that has 1 to 5 carbon atoms and may have a branched structure, X independently represents —O—, —S—, —C(O)NH—, —NHC(O)—, an alkylene group that has 1 to 5 carbon atoms and may have a branched structure, or an alkylenedioxo group that has 1 to 5 carbon atoms and may have a branched structure, Y represents a group of the general formula (20)

[Chemical Formula 7]

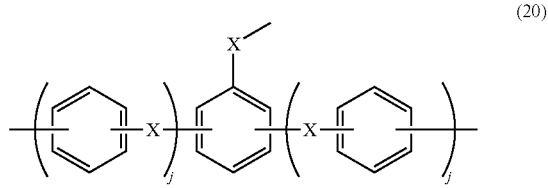 (20)

(wherein X has the same meaning as defined above, and j is 0 or 1), $Ar^1$, $Ar^3$ and $Ar^4$ independently represent a divalent benzene ring that may be substituted with W, a divalent naphthalene ring that may be substituted with W, a divalent biphenyl group that may be substituted with W, a divalent terphenyl group that may be substituted with W or a divalent fluorene group that may be substituted with W, $Ar^2$ represents a phenyl group that may be substituted with W, a naphthyl group that may be substituted with W, a biphenyl group that may be substituted with W, a terphenyl group that may be substituted with W or a fluorene group that may be substituted with W, W represents fluorine, an alkyl group that has 1 to 8 carbon atoms and may have a branched structure or an alkoxy group that has 1 to 8 carbon atoms and may have a branched structure, and i is an integer of 1 to 4] and k is a positive integer.

[8] The charge transporting varnish of [6], wherein the polymer is made of a polyimide precursor represented by the general formula (21) or a polyimide obtained by hydration ring closure of the polyimide precursor

[Chemical Formula 8]

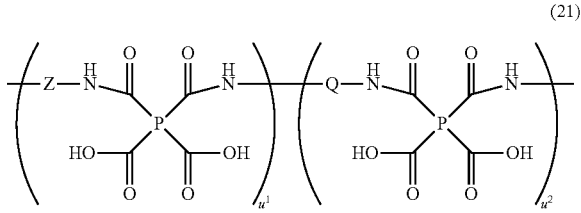 (21)

(wherein P and Q, respectively, have the same meanings as defined above, Z is at least one divalent organic group selected from the general formula (18) or (19), $u^1$ and $u^2$ are independently an integer of 1 or over, and is such that $u^1/(u^1+u^2) \geq 0.2$ is satisfied).

[9] The charge transporting varnish of [8], wherein the Z is at least one divalent organic group selected from those of the general formulas (22) to (27)

[Chemical Formula 9]

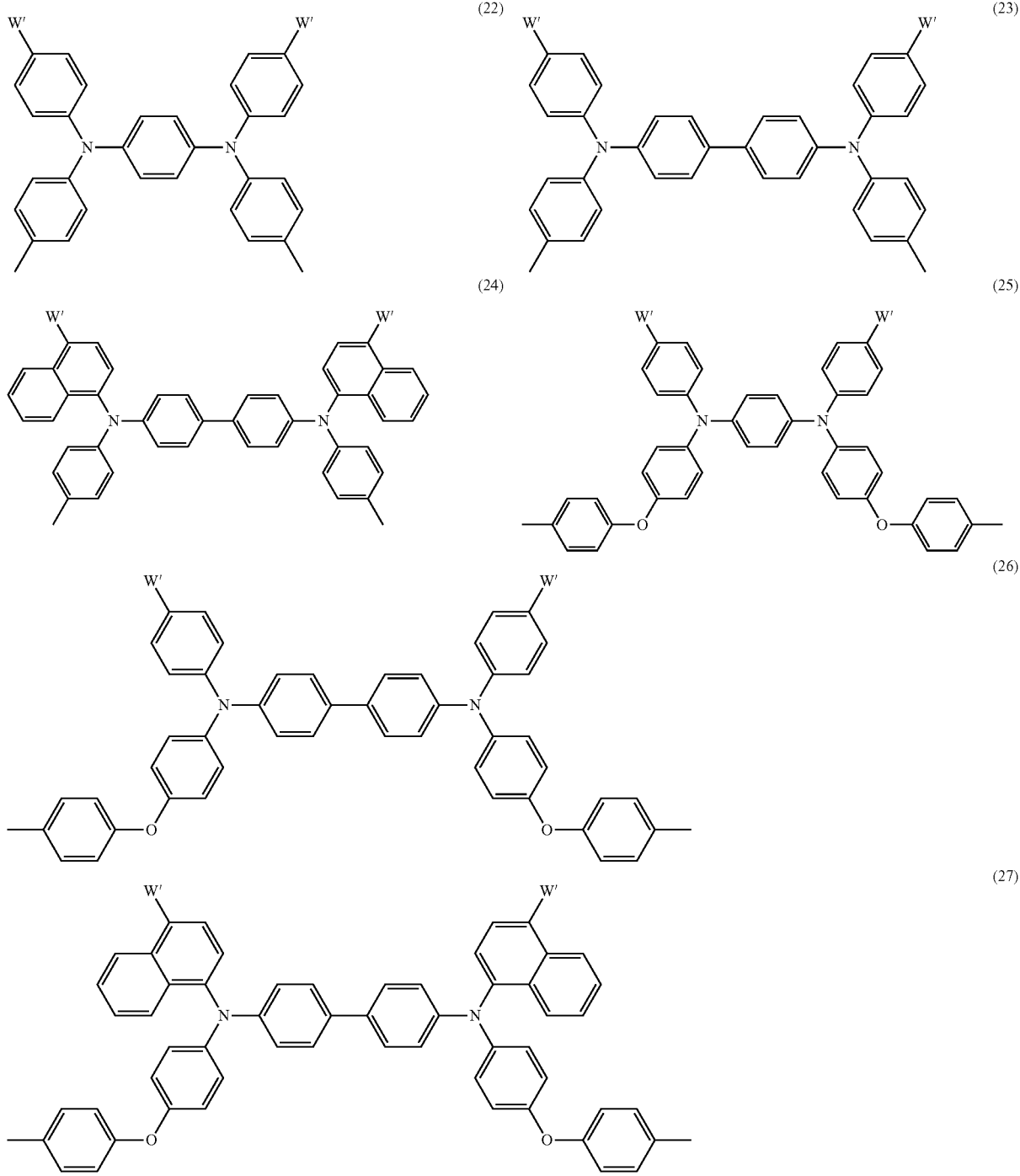

(wherein W' represents a hydrogen atom, fluorine, an alkyl group that has 1 to 8 carbon atoms and may have a branched structure or an alkoxy group that has 1 to 8 carbon atoms and may have a branched structure).

[10] The charge transporting thin film formed by use of the charge transporting varnish of any one of [1] to [9].

[11] The organic electroluminescent device including at least one layer made of the charge transporting thin film of [10].

Effect of the Invention

When using the charge transporting varnish of the present invention, there can be obtained a charge transporting thin film which has high uniformity and flatness and excellent mechanical strength, heat resistance and transparency. This thin film can be formed by various methods including spin coating, printing, spraying and the like methods.

When the charge transporting thin film of the invention is formed on an electrode surface, the electrode surface can be flattened and rendered uniform, ensuring prevention of electric short-circuiting. Especially, when the thin film is used as a charge injection layer and a charge transporting layer of an organic EL device, light emitted from an emission layer is able to pass well therethrough and can be taken out to outside in an efficient manner, with the possibility of realizing improved initial characteristics such as of a low drive voltage and a high emission efficiency or a prolonged life of the device.

As stated hereinabove, the charge transporting varnish of the present invention ensures high flatness and heat resistance and can be readily converted to a charge transport thin film by many coating methods and is useful for application to organic electron devices such as an organic electric field-effect device, and application as a capacitor electrode protecting film and an antistatic film.

BEST MODE FOR CARRYING OUT THE INVENTION

Figure 1:
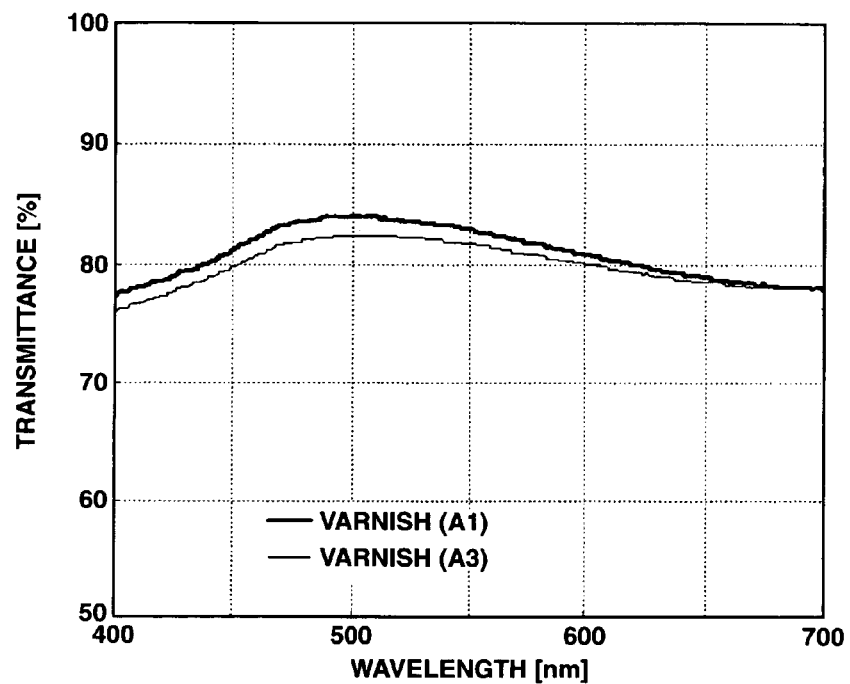
FIG. 1 is a transmission spectrum, at 400 nm to 700 nm, of each of thin films formed by coating and baking varnishes (A1) and (A3) on a quartz substrate.

The present invention is described in more detail.

The charge transporting varnish of the invention includes a charge transporting substance made of a charge transporting oligoaniline having a number average molecular weight of 250 to 5000 or a charge transporting organic material made of the charge transporting substance and a charge accepting dopant substance, and at least one polymer selected from polyimides and polyimide precursors, the charge transporting substance or charge transporting organic material and the polymer being dissolved or dispersed (preferably uniformly dispersed) in at least one solvent.

Taking into consideration improved flatness and uniformity of the charge transporting thin film obtained by coating and baking on a substrate or the like, the charge transporting substance or charge transporting organic material and the polymer should preferably be dissolved in at least one solvent.

It will be noted that the charge transportability used herein has the same meaning as electric conductivity and means any one of hole transportability, electron transportability and charge transportability of both hole and electron. The charge transporting varnish of the invention may be one which has charge transportability in itself or may be one wherein a solid film obtained from the varnish exhibits charge transportability.

Although the charge transporting substance used in the invention is not limited to specific ones in so far as a charge transporting oligoaniline capable of being dissolved or dispersed in a solvent is used, it is preferable from the standpoint of the flatness and uniformity of a charge transporting thin film obtained that those substances capable of being dissolved in a solvent are preferable.

In the practice of the invention, the number average molecular weight of the charge transporting oligoaniline is preferably at 250 to 5000. If the number average molecular weight is smaller than 250, volatility becomes so high, with the high possibility that charge transportability cannot be developed satisfactorily. On the other hand, when the molecular weight exceeds 5000, solubility in solvent becomes too low, so that there is the high possibility not suited for use.

Especially, when taking improved solubility in solvent for charge transporting substance into account, the number average molecular weight should favorably be 2000 or below, optimally 800 or below.

It will be noted that the number average molecular weight is a value measured by gel permeation chromatography (calculated as polyethylene).

When it is taken into consideration that the charge transporting substance causes solubility and charge transportability to become uniform, it is preferable to use an oligoaniline having no distribution of molecular weight, i.e. having a dispersity at 1. Taking solubility in solvent and transparency of a solution into account, a product obtained by reduction with hydrazine is preferable.

Furthermore, because of high solubility and high charge transportability and also of an appropriate degree of ionization potential, oligoaniline derivatives represented by the general formula (1) or quinonediimine derivatives that are oxidized products of the former are preferable.

[Chemical Formula 10]

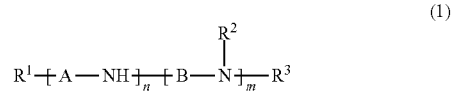

(1)

[wherein $R^1$, $R^2$ and $R^3$ independently represent hydrogen, a monovalent hydrocarbon group or an organoxy group, and A and B independently represent a divalent group represented by the general formula (2) or (3)

[Chemical Formula 11]

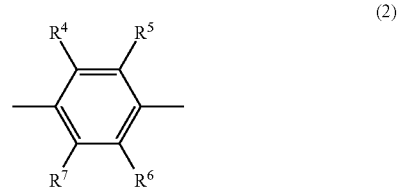

(2)

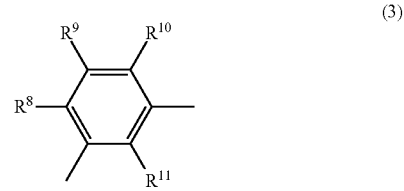

(3)

(wherein $R^4$ to $R^{11}$ independently represent hydrogen, a hydroxyl group, a monovalent hydrocarbon group, an organoxy group, an acyl group or a sulfone group, and m and n are independently an integer of 1 or over, and is such that m+n≤20 is satisfied)].

When taking into account the fact that if a π conjugated system in the molecule is extended to an extent as far as possible, charge transportability of the resulting charge transporting thin film is improved, the oligoaniline derivatives represented by the general formula (4) or quinonediimine derivatives that are oxidized products of the former should preferably be used.

[Chemical Formula 12]

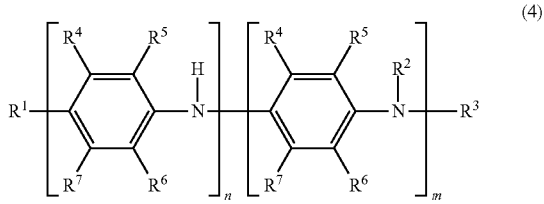

(wherein $R^1$ to $R^7$, m and n, respectively, have the same meanings as defined above).

In the general formulas (1) and (4), m+n is preferably at 4 or over from the standpoint that good charge transportability is shown and is more preferably at 16 or less from the standpoint that solubility in solvent is ensured.

These charge transporting materials may be used singly or in combination of two or more.

For the monovalent hydrocarbon group, organoxy group and acyl group in $R^1$ to $R^{11}$, the following groups are mentioned.

Specific examples of the monovalent hydrocarbon group include: an alkyl group such as a methyl group, an ethyl group, a propyl group, a butyl group, a t-butyl group, a hexyl group, an octyl group, a decyl group or the like; cycloalkyl groups such as a cyclopentyl group, a cyclohexyl group or the like; a bicycloalkyl group such as bicyclohexyl group or the like; an alkenyl group such as a vinyl group, a 1-propenyl group, a 2-propenyl group, an isopropenyl group, a 1-methyl-2-propenyl group, a 1, 2 or 3-butenyl group, a hexenyl group or the like; an aryl group such as a phenyl group, a xylyl group, a tolyl group, a biphenyl group, a naphthyl group or the like; an aralkyl group such as a benzyl group, a phenylethyl group, a phenylcyclohexyl group or the like; and a group wherein the above-mentioned monovalent hydrocarbon groups are substituted at part or all of the hydrogen atoms thereof with a halogen atom, a hydroxyl group and/or an alkoxy group.

Specific examples of the organoxy group include an alkoxy group, an alkenyloxy group, an aryloxy group and the like, with the alkyl group, alkenyl group and aryl group constituting these groups being the same as those groups indicated above.

Specific groups of the acyl group include a formyl group, an acetyl group, a propionyl group, a butyric group, an isobutyryl group, a valeryl group, an isovaleryl group, a benzoyl group and the like.

The number of carbons of the monovalent hydrocarbon group, organoxy group and acyl group is not critical and is generally 1 to 20, preferably 1 to 8.

$R^1$ and $R^4$ to $R^{11}$ preferably include: hydrogen; an unsubstituted or substituted aryl group such as a phenyl group, a xylyl group, a tolyl group, a biphenyl group, a naphthyl group or the like; an alkyl group having 1 to 5 carbon atoms; an alkoxy group having 1 to 5 carbon atoms; and an acyl group such as a formyl group, an acetyl group, a propionyl group, a butyric group, an isobutyryl group, a benzoyl group or the like. From the standpoint of improving solubility in organic solvent, hydrogen, an alkyl group having 1 to 5 carbon atoms, and an alkoxy group having 1 to 5 carbon atoms are preferable.

From the standpoint of improving solubility in organic solvent, $R^2$ is preferably hydrogen, an alkyl group having 1 to 5 carbon atoms and a phenyl group, and from the standpoint of showing good charge transportability, $R^2$ is preferably hydrogen, a methyl group, and an unsubstituted or substituted aryl group such as a xylyl group, a tolyl group, a biphenyl group, a naphthyl group or the like. From the viewpoint of achieving a good balance between the solubility and the charge transportability, hydrogen, a methyl group or a phenyl group is more preferable.

From the standpoint of showing good charge transportability, $R^3$ is preferably hydrogen, an unsubstituted or substituted aryl group such as a phenyl group, a xylyl group, a tolyl group, a biphenyl group, a naphthyl group or the like, an alkyl group having 1 to 5 carbon atoms, and an alkoxy group having 1 to 5 carbon atoms, of which an aryl group such as a phenyl group, a xylyl group, a biphenyl group, a naphthyl group or the like is more preferable.

Especially, the case where $R^1$ is a hydrogen atom and $R^3$ is a phenyl group, i.e., the oligoaniline compound of the formula (4) which is blocked with a phenyl group at opposite ends thereof, is preferable.

Specific examples of such a compound include oligoaniline derivatives soluble in organic solvents such as phenyltetraaniline, phenylpentaaniline, tetraaniline (aniline tetramer) octaaniline (aniline octomer) and the like.

It will be noted that although the method of synthesizing these oligoaniline derivatives is not critical, there can be used a method described, for example, in Bulletin of Chemical Society of Japan, 1994, Vol. 67, pp. 1749 to 1752 and Synthetic Metals, United States of America, 1997, Vol. 84, pp. 119 to 120.

For a charge transporting material constituting a charge transporting varnish of the invention, mention is made, aside from an embodiment using a charge transporting substance alone, of a charge transporting organic material made of a charge transporting substance and a charge accepting dopant substance. This charge transporting organic material is not critical in so far as it is dissolved or dispersed in a solvent. Taking the flatness and uniformity of the resulting charge transporting thin film into account, it is preferable to use a material that is soluble in a solvent. With respect to the solubility of a charge accepting dopant substance, the type of substance is not critical provided that it is dissolved in at least one type of solvent used in a varnish.

The charge accepting dopant substance is one which is added for the purpose of improving charge transportability of a charge transporting substance. More particularly, an electron accepting dopant substance is used for a hole transporting substance and a hole accepting dopant substance is used for an electron transporting substance. In either case, substances having high charge acceptability are preferable.

In the practice of the invention, because a charge transporting oligoaniline in a charge transporting varnish generally exhibits hole transportability, an electron accepting dopant substance is preferably used as a charge accepting dopant substance.

Specific examples of the electron accepting dopant include: inorganic strong acids such as hydrogen chloride, sulfuric acid, nitric acid, phosphoric acid and the like; Lewis acids such as aluminum (III) chloride ($AlCl_3$), titanium (IV) tetrachloride ($TiCl_4$), boron tribromide ($BBr_3$), boron trifluoride ether complex ($BF_3OEt_3$), iron (III) chloride ($FeCl_3$), copper (II) chloride ($CuCl_2$), antimony (V) pentachloride (SbCl$_5$), arsenic (V) pentafluoride (AsF$_5$), phosphorus pentafluoride (PF$_5$), tris(4-bromophenyl)aluminum hexachloroantimonate (TBPAH) and the like; strong organic acids such as benzenesulfonic acid, tosylic acid, camphorsulfonic acid, hydroxybenzenesulfonic acid, 5-sulfosalicyclic acid, dodecylbenzenesulfonic acid, polystyrenesulfonic acid and the like; and organic or inorganic oxidizing agents such as 7,7,8,8-tetracyanoquinodimethane (TCNQ), 2,3-dichloro-5,6-dicyano-1,4-benzoquinone (DDQ), iodine and the like.

Specific examples of the hole accepting dopant include alkali metals (Li, Na, K, Cs), and metal complexes such as lithium quinolilate (Liq), lithium acetylacetonate (Li(acac)) and the like although not limited thereto.

Those charge accepting dopant substances may be used singly or in combination of two or more.

In the present invention, both charge transporting substance and charge accepting dopant substance should preferably be in an amorphous solid form. If the use of a crystalline solid as at least one substance is needed, it is preferable to use a material that shows amorphous solidness after film formation of a varnish comprised of a charge transporting substance, a charge accepting dopant substance and a solvent containing a highly viscous solvent described in detail hereinafter.

Especially, where at least one of the charge transporting substance and charge accepting dopant substance is in a crystalline solid form, the other substance should preferably be one that has a random intermolecular interaction. And where a low molecular compound is used as a charge accepting dopant, it is beneficial to use, for example, a compound having three or more, different polar functional groups in the molecule.

No specific limitation is placed on such a compound and mention is made, for example, of tiron, dihydroxybenzenesulfonic acid, and sulfonic acid derivatives represented by the general formula (28). Of these, sulfonic acid derivatives represented by the general formula (28) are preferable. Specific examples of the sulfonic acid derivative include sulfosalicylic acid derivatives such as, for example, 5-sulfosalicylic acid and the like.

[Chemical Formula 13]

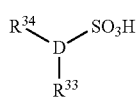
(28)

(wherein D represents a benzene ring, a naphthalene ring, an anthracene ring, a phenanthrene ring or a heterocyclic ring, and R$^{33}$ and R$^{34}$ independently represent a carboxyl group or a hydroxyl group).

The polyimide or polyimide precursor present in the charge transporting varnish of the invention is added to the charge transporting varnish for the purpose of mainly improving mechanical strength, heat resistance and transparency of the charge transporting thin film obtained by coating and baking the charge transporting varnish of the invention.

If the content of the polyimide or polyimide precursor is low, the effect of improving mechanical strength and the like may not be shown. If the content is too high, the charge transportability of a charge transporting thin film may lower, with the possibility that a conductive function of the thin film is impeded. Taking these into consideration, the content of the polyimide or polyimide precursor in the charge transporting varnish is such that a lower limit is at about 0.1 wt %, preferably at 1 wt % and more preferably at 5 wt % and an upper limit is at about 50 wt %, preferably at 30 wt % and more preferably at 20 wt %, all based on the total weight of the charge transporting varnish.

Although no limitation is placed on the polymer used in the invention so far as a polyimide or polyimide precursor dissolved or dispersed in a solvent is used, it is preferable to use one that is dissolved in a solvent when taking into account the flatness and uniformity of the resulting charge transporting thin film.

Polyimides or polyimide precursors may be used singly or in combination of two or more.

Especially, from the viewpoint of transparency and polymerization reactivity, polyimides or polyimide precursors used in the invention should preferably be those polyimide precursors of the general formula (5) or polyimides obtained by subjecting the just-mentioned polyimide precursors to dehydration ring closure

[Chemical Formula 14]

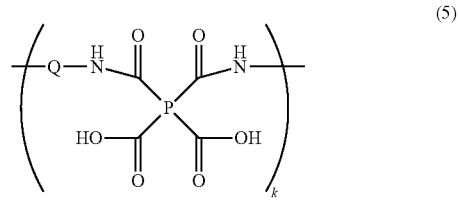
(5)

In the formula (5), P is at least one tetravalent organic group selected from those of the general formulas (6) to (12) and, taking transparent of a varnish into account, is preferably a group represented by the general formula (6) to (9).

Q is at least one divalent organic group selected from those of the general formulas (13) to (19), and k is a positive integer.

[Chemical Formula 15]

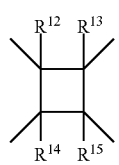
(6)

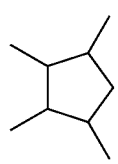
(7)

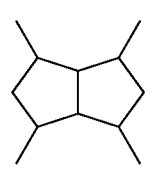
(8)

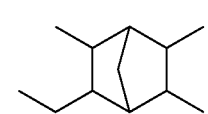
(9)

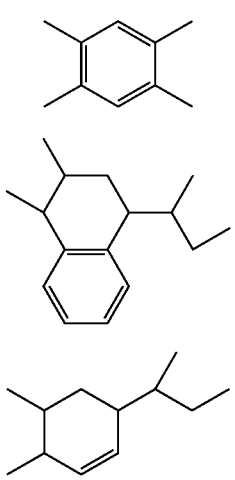

(10)

(11)

(12)

[wherein $R^{12}$ to $R^{15}$ independently represent hydrogen, fluorine, an alkyl group that has 1 to 5 carbon atoms and may be branched, or an alkoxy group that has 1 to 5 carbon atoms and may be branched].

[Chemical Formula 16]

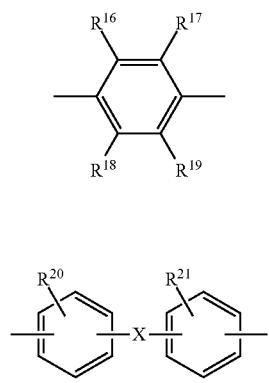

(13)

(14)

(15)

(16)

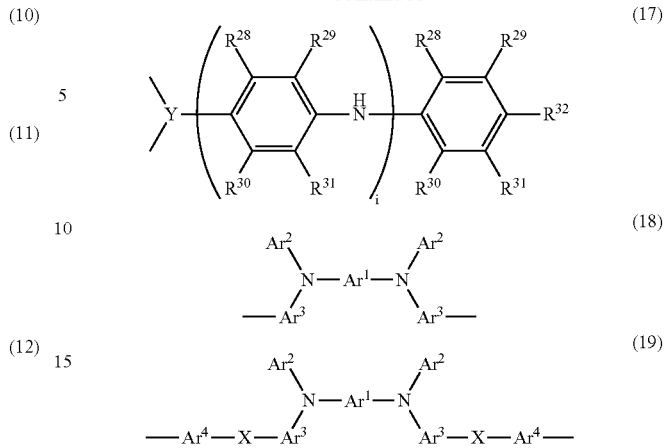

(17)

(18)

(19)

In the formulas, $R^{16}$ to $R^{32}$ independently represent hydrogen, fluorine, an alkyl group that has 1 to 5 carbon atoms and may be branched, or an alkoxy group that has 1 to 5 carbon atoms and may be branched, X independently represents a single bond, an ether bond, a thioether bond, an amido bond, an alkylene group that has 1 to 5 carbon atoms and may be branched, or an alkylenedioxo group that has 1 to 5 carbon atoms and may be branched, Y represents a group of the general formula (20), $Ar^1$, $Ar^3$ and $Ar^4$ independently represent a divalent benzene ring that may be substituted with W, a divalent naphthalene ring that may be substituted with W, a divalent biphenyl group that may be substituted with W, a divalent terphenyl group that may be substituted with W, or a divalent fluorene group that may be substituted with W, $Ar^2$ represents a phenyl group that may be substituted with W, a naphthyl group that may be substituted with W, a biphenyl group that may be substituted with W, a terphenyl group that may be substituted with W, or a fluorene group that may be substituted with W, W represents fluorine, an alkyl group that has 1 to 8 carbon atoms and may be branched, or an alkoxy group that has 1 to 8 carbon atoms and may be branched, and i is an integer of from 1 to 4.

[Chemical Formula 17]

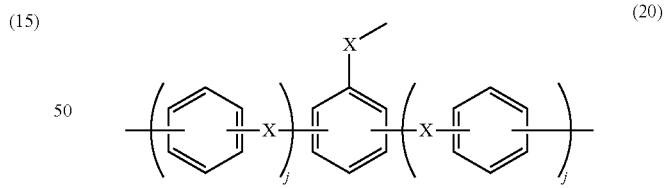

(20)

(wherein X has the same meaning as defined above and j is 0 or 1).

In the above formula, specific examples of the alkyl group that has 1 to 5 carbon atoms and may be branched include a methyl group, an ethyl group, an n-propyl group, an i-propyl group, an n-butyl group, an s-butyl group, an i-butyl group, a t-butyl group, an n-pentyl group, an i-pentyl group, a neopentyl group, a t-pentyl group, a 1-methylbutyl group, a 2-methylbutyl group, a 1-ethyl propyl group and the like.

Specific examples of the alkoxy group that has 1 to 5 carbon atoms and may be branched include a methoxy group, an ethoxy group, an n-propoxy group, an i-propoxy group, an n-butoxy group, an s-butoxy group, an i-butoxy group, a t-butoxy group, an n-pentyloxy group, an i-pentyloxy group, a neo-pentyloxy group, a t-pentyloxy group, a 1-methylbutoxy group, a 2-methylbutoxy group, a 1-ethyl propoxy group and the like.

Specific examples of the alkylene group that has 1 to 5 carbon atoms and may be branched include a methylene group, an ethylene group, a trimethylene group, a tetramethylene group, a pentamethylene group, a propylene group, an ethylethylene group, a 1,1-dimethylethylene group, a 1,2-dimethylethylene group, a 1-(n-propyl)ethylene group, a 1-(i-propyl)ethylene group, a 1-ethyl-2-methylethylene group, a 1-methyltrimethylene group, a 2-methyltrimethylene group, a 1,1-dimethyltrimethylene group, a 1,3-dimethyltrimethylene group, a 1-methyltetramethylene group and the like.

Specific examples of the alkylenedioxo group that has 1 to 5 carbon atoms and may be branched include a methylenedioxo group, an ethylenedioxo group, a trimethylenedioxo group, a tetramethylenedioxo group, a pentamethylenedioxo group, a propylenedioxo group, an ethylethylenedioxo group, a 1,1-diemthylethylenedioxo group, a 1,2-dimethylethylenedioxo group, a 1-(n-propyl)ethylenedioxo group, a 1-(i-propyl)ethylenedioxo group, a 1-ethyl-2-methylethylenedioxo group, a 1-methyltrimethylenedioxo group, a 2-methyltrimethylenedioxo group, a 1,1-dimethyltriemthylenedioxo group, a 1,3-dimethyltrimethylenedioxo group, a 1-methyltetramethylenedioxo group and the like.

Specific examples of the alkyl group that has 1 to 8 carbon atoms and may be branched include, aside from those groups indicated above with respect to the alkyl group having 1 to 5 carbon atoms, an n-hexyl group, an i-hexyl group, a 1-methylpentyl group, a 1,3-dimethylbutoxy group, a 1-ethylbutyl group, a 2-ethylbutyl group, a 1-methyl-1-ethylpropyl group, an n-heptyl group, a 1-methylhexyl group, a 5-methylhexyl group, a 1-ethylpentyl group, a 1-(n-propyl)-butyl group, an n-octyl group, a 1-methylpentyl group, a 2-methylpentyl group, a 1-ethylhexyl group, a 2-ethylhexyl group and the like.

Further specific examples of the alkyl group that has 1 to 8 carbon atoms and may be branched include, aside from those groups indicated above with respect to the alkyl group having 1 to 5 carbon atoms, an n-hexyloxo group, an i-hexyloxo group, a 1-methylpentyloxo group, a 1,3-dimethylbutoxy group, a 1-ethylbutoxy group, a 2-ethylbutoxy group, a 1-methyl-1-ethylpropoxy group, an n-heptyloxo group, a 1-methylhexyloxo group, a 5-methylhexyloxo group, a 1-ethylpentyloxo group, a 1-(n-propyl)-butoxy group, an n-octyloxo group, a 1-methylpentyloxo group, a 2-methylpentyloxo group, a 1-ethylhexyloxo group, a 2-ethylhexyloxo group and the like.

Further, it is preferable from the standpoint of charge transportability that the polyimide or polyimide precursor used in the invention is a polyimide precursor represented by the general formula (21) or a polyimide obtained by imide dehydration ring closure of the just-mentioned polyimide precursor.

[Chemical Formula 18]

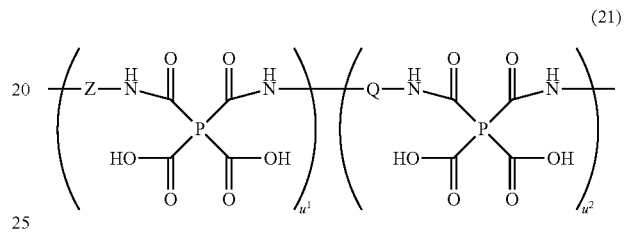

(21)

(wherein P and Q, respectively, have the same meanings as defined before, Z is at least one divalent organic group selected from the afore-indicated general formula (18) or (19), and $u^1$ and $u^2$ independently represent an integer of 1 or over, and is such that $u^1/(u^1+u^2) \geq 0.2$ is satisfied).

The group of Z contains a tertiary arylamine skeleton and may serve as a charge transporting site and is introduced so as to mainly improve a charge injection efficiency of thin film.

Accordingly, if the content of Z in the formula is too low, the resulting polyimide precursor or polyimide may not show satisfactory charge transportability. To this end, the value of $u^1/(u^1+u^2)$ in the formula (21) is preferably at 0.2, more preferably at 0.5 and most preferably at 0.8 as a lower limit thereof.

Examples of the structures of z are general formulas (22) to (27) as below.

[Chemical Formula 19]

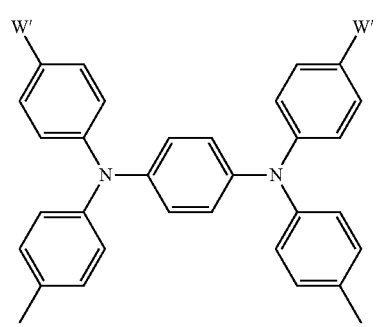

(22)

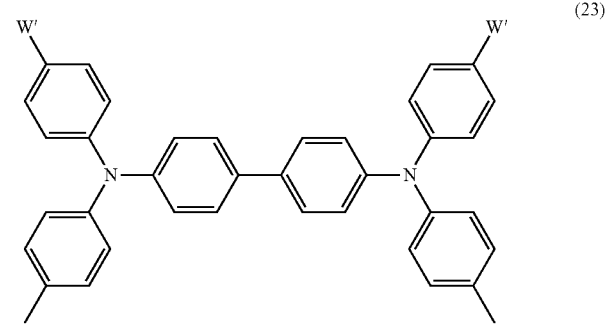

(23)

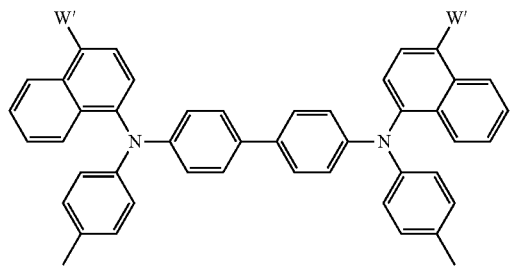

(24)

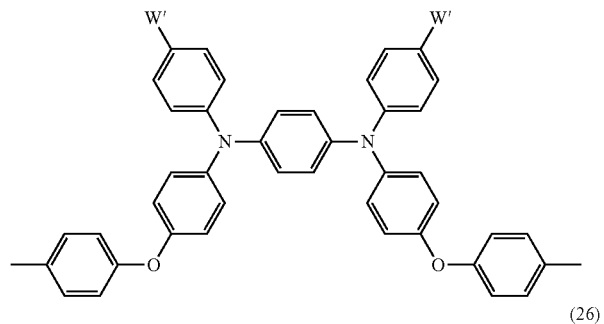

(25)

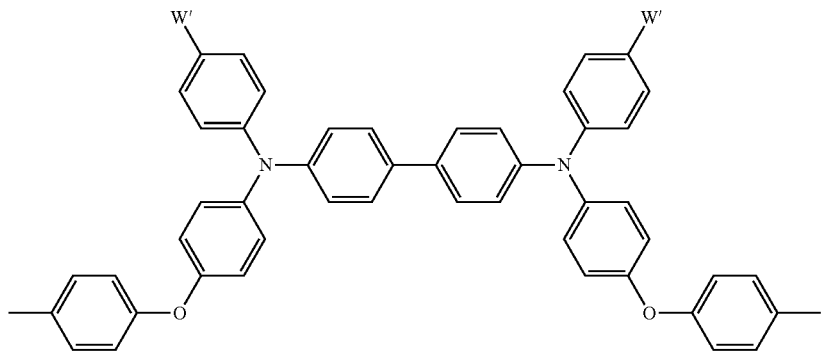

(26)

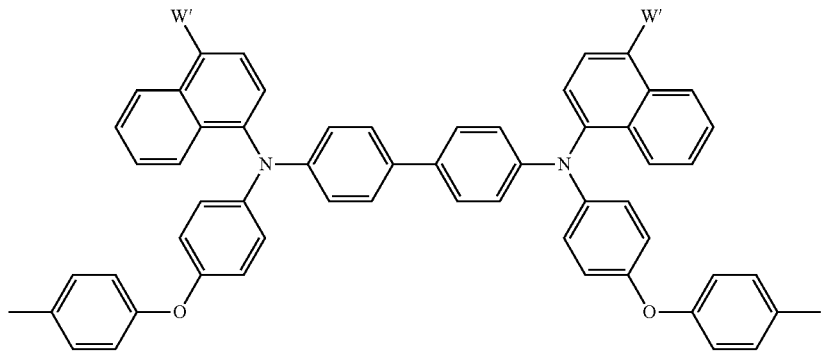

(27)

(wherein W' represents a hydrogen atom, fluorine, an alkyl group that has 1 to 8 carbon atoms and may be branched, or an alkoxy group that has 1 to 8 carbon atoms and may be branched).

The method of preparing the polyimide or polyimide precursor used in the charge transporting varnish of the invention is not limited to a specific one. For the method of preparing the polyimide precursor, mention is made, for example, of a method wherein tetracarboxylic acid and a derivative thereof, and a primary diamine are polymerized. For the method of preparing a polyimide, mention is made, for example, of a method in which the polyimide precursor obtained by the above method is thermally dehydrated at 100 to 400° C., or a method in which chemical imidization is carried out by use of a conventionally employed imidization catalyst such as of triethylamine/acetic anhydride. In order to ensure solubility in these methods, part of a polyimide precursor may be left without imidization.

For the tetracarboxylic acid derivative used for the preparation of the polyimide precursor, it is usual to use tetracarboxylic acid dianhydride.

The ratio of the total moles of a primary amine to the total moles of tetracarboxylic acid dianhydride is preferably 0.80 to 1.20. If the primary amine is used in excess, the resulting solution may be densely colored in some case, and if an acid anhydride is used in excess, an unstable structure such as of an anhydride-terminal polyimide precursor may occur. Taking these into consideration, the ratio of the total moles of the primary amine is more preferably 1.05 to 1.10. Like an ordinary polycondensation reaction, as the ratio of the total moles is closer to 1, the resulting polymer has a greater degree of polymerization. If the degree of polymerization is too small, the strength of a polyimide film may become poor, and if the degree of polymerization is too great, workability on formation of polyimide film may become worsened. For this, in the charge transporting varnish of the invention, the number average molecular weight of the polyimide or polyimide precursor is preferably at 1,000 to 50,000, more preferably at 5,000 to 30,000.

The method of polymerization by reaction between a tetracarboxylic acid dianhydride and a primary diamine is not critical. In general, there is adopted a method in which a polyimide precursor is prepared by a primary diamine is dissolved in an organic polar solvent such as N-methyl-2-pyrrolidone (hereinafter abbreviated as NMP), N,N-dimethylacetamide (hereinafter abbreviated as DMAc), N,N-dimethylformamide (hereinafter abbreviated as DMF) or the like, to which a tetracarboxylic acid dianhydride is added for reaction. The reaction temperature may be arbitrarily selected from a temperature range of −20 to 150° C., preferably −5 to 100° C.

Specific examples of the tetracarboxylic acid and derivatives thereof used to obtain the polyimide or polyimide precursor include: aromatic tetracarboxylic acids, and dianhydrides thereof and their dicarboxylic acid diacid halides such as pyromellitic acid, 2,3,6,7-naphthalenetetracarboxylic acid, 1,2,5,6-naphthalenetetracarboxylic acid, 1,4,5,8-naphthalenetetracarboxylic acid, 3,3',4,4'-biphenyltetracarboxylic acid, 2,3,3',4-biphenyltetracarboxylic acid, bis(3,4-dicarboxyphenyl)ether, 3,3',4,4'-benzophenonetetracarboxylic acid, bis(3,4-dicarboxyphenyl)sulfone, bis(3,4-dicarboxyphenyl)methane, 2,2-bis(3,4-dicarboxyphenyl)propane, 1,1,1,3,3,3-hexafluoro-2,2-bis(3,4-dicarboxyphenyl)propane, bis(3,4-dicarboxyphenyl)diphenylsilane, 2,3,4,5-pyridinetetracarboxylic acid, 2,6-bis(3,4-dicarboxyphenyl)pyridine and the like; alicyclic tetracarboxylic acids, and acid dihydrides thereof and their dicarboxylic acid diacid halides such as 1,2,3,4-cyclobutanetetracarboxylic acid, 1,2-dimethyl-1,2,3,4-cycobutanetetracarboxylic acid, 1,3-dimethyl-1,2,3,4-cyclobutanetetracarboxylic acid, 1,2,3,4-tetramethyl-1,2,3,4-cyclobutanetetracarboxylic acid, 1,2,3,4-tetrafluoro-1,2,3,4-cyclobutanetetracarboxylic acid, 1,2,3,4-cyclopentanetetracarboxylic acid, bicyclo[3,3,0]octane-2,4,6,8-tetracarboxylic acid, 3,5,6-tricarboxybicyclo[2,2,1]hexane-2-acetic acid, 2,3,5-tricarboxycyclopentylacetic acid, 3,4-dicarboxy,1,2,3,4-tetrahydro-1-naphthalenesuccinic acid, 4,5-dicarboxy-2-cyclohexene-1-yl-succinic acid and the like; aliphatic tetracarboxylic acids, and dianhydrides thereof and their dicarboxylic acid diacid halides such as 1,2,3,4-butanetetracarboxylic acid. These tetracarboxylic acids and derivatives thereof may be used singly or in combination of two or more.

The diamines used to obtain polyimides or polyimide precursors are not critical in type. Mention is made, for example, of: aromatic diamines such as p-phenylenediamine, m-phenylenediamine, 2,5-diaminotoluene, 2,6-diaminotoluene, 4,4'-diaminobiphenyl, 3,3'-dimethyl-4,4'-diaminobiphenyl, diaminodiphenylmethane, diaminodiphenyl ether, 2,2'-diaminodiphenylpropane, bis(3,5-diethyl-4-aminophenyl)methane, diaminodiphenylsulfone, diaminobenzophenone, diaminonaphthalene, 1,4-bis(4-aminophenoxy)benzene, 1,4-bis(4-aminophenyl)benzene, 9,10-bis(4-aminophenyl)anthracene, 1,3-bis(4-aminophenoxy)benzene, 4,4'-bis(4-aminophenoxy)diphenylsulfone, 2,2-bis[4-(4-aminophenoxy)phenyl]propane, 2,2-bis(4-aminophenyl)hexafluoropropane, 2,2-bis[4[(4-aminophenoxy)phenyl]hexanefluoropropane and the like; alicyclic diamines such as bis(4-aminocyclohexyl)methane, bis(4-amino-3-methylcyclohexyl)methane and the like; aliphatic diamines such as tetramethylenediamine, hexamethylenediamine and the like; diaminosiloxanes such as of the general formula (29) (wherein L is an integer of 1 to 10); diamines having an oligoaniline skeleton such as 4,4'-diaminodiphenylamine, N,N'-bis(4-aminophenyl)-1,4-benzenediamine, N-(4-aminophenyl)-N'-[4-[4-aminophenyl]amino]phenyl]-1,4-benzenediamine, N,N'-bis[4-[(4-aminophenyl)amino]phenyl]-1,4-benzenediamine, 4-[4-(phenylamino)phenoxy]-1,3-benzenediamine, 4-[4-[[4-(phenylamino)phenyl]amino]phenoxy]-1,3-benzenediamine, 4-[4-[[4-[[4-(phenylamino)phenyl]amino]phenyl]amino]-phenoxy]-1,3-benzenediamine, 4-[4-[[4-[[4-(phenylamino)phenyl]amino]phenyl]amino]-phenyl]amino]phenoxy]-1,3-benzenediamine, and the like; and diamines having tertiary arylamine skeletons represented by the general formulas (30) to (42). It will be noted that these diamines may be used singly or in combination of two or more.

[Chemical Formula 20]

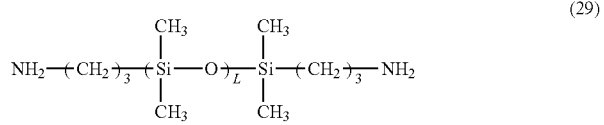

(29)

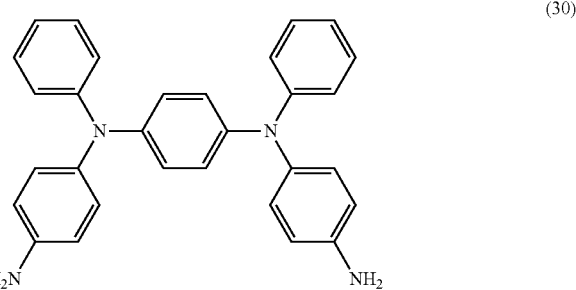

(30)

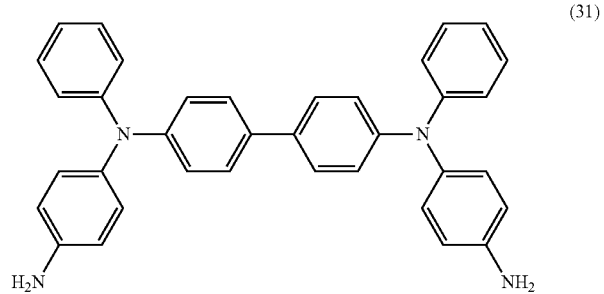

(31)

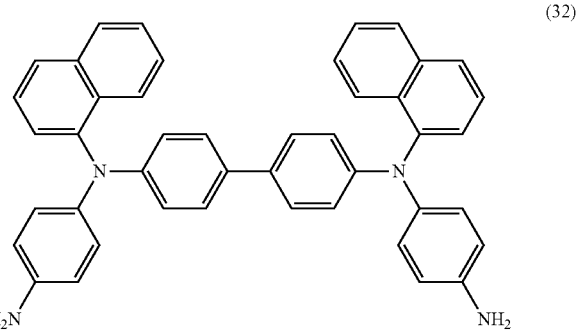

(32)

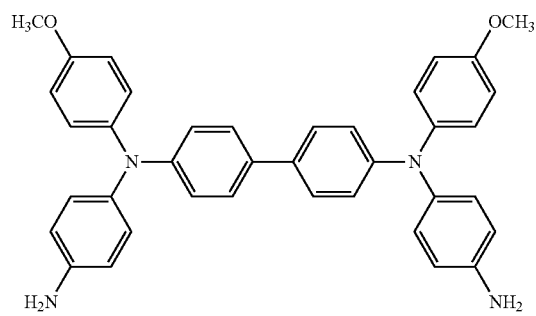
(33)
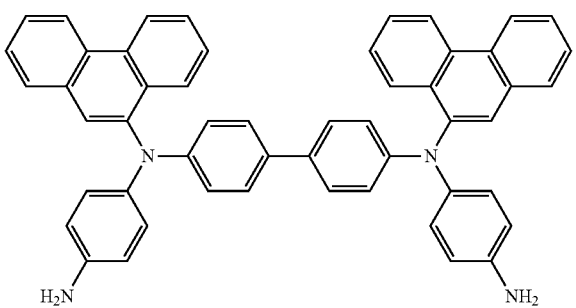
(34)
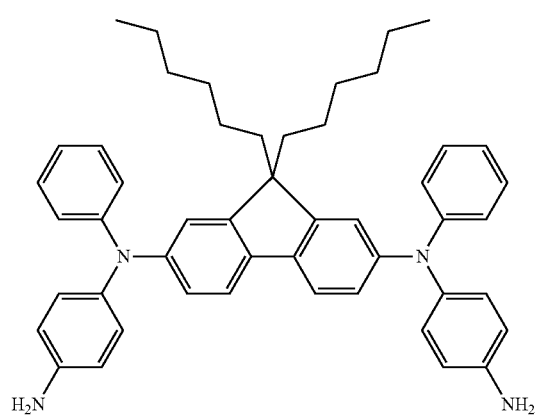
(35)
[Chemical Formula 21]
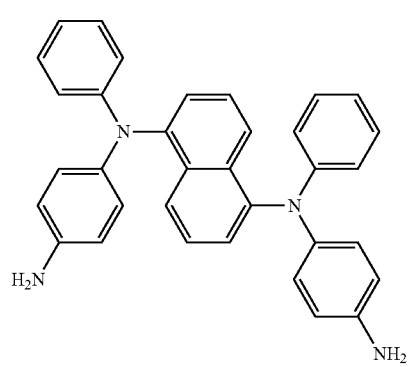
(36)
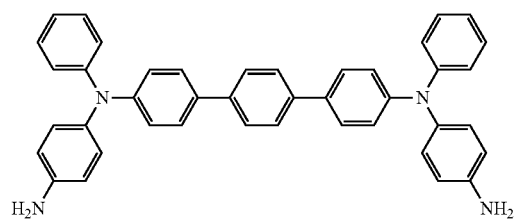
(37)
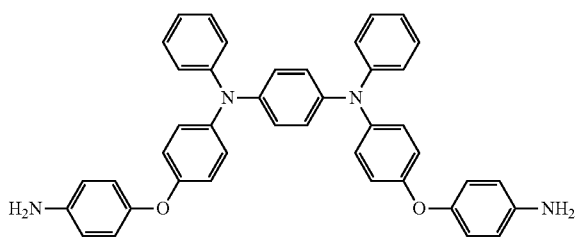
(38)

-continued

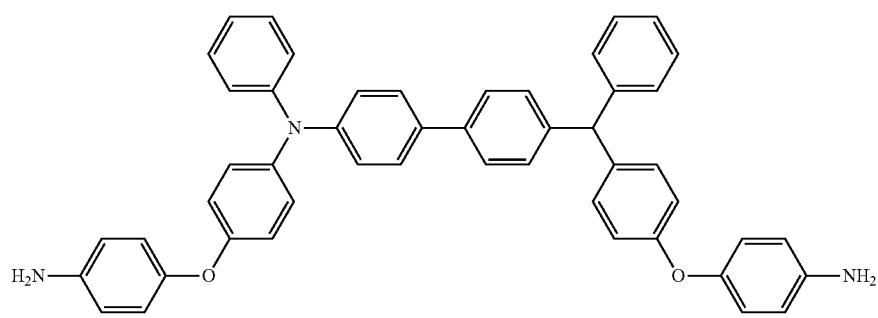

(39)

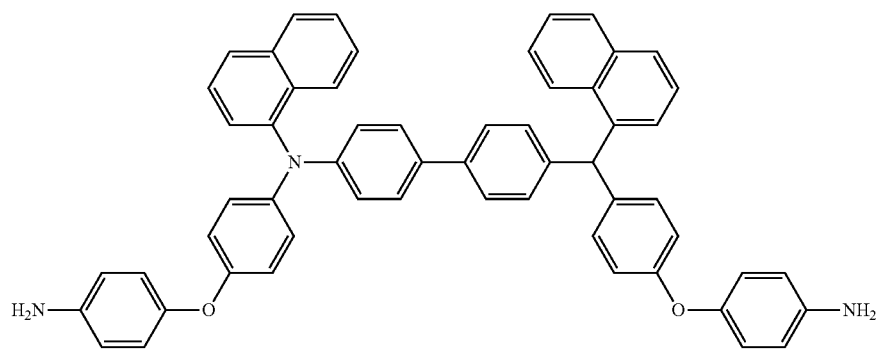

(40)

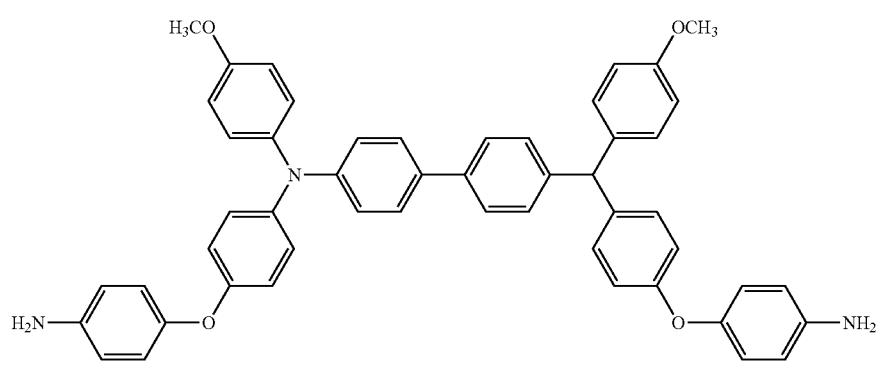

(41)

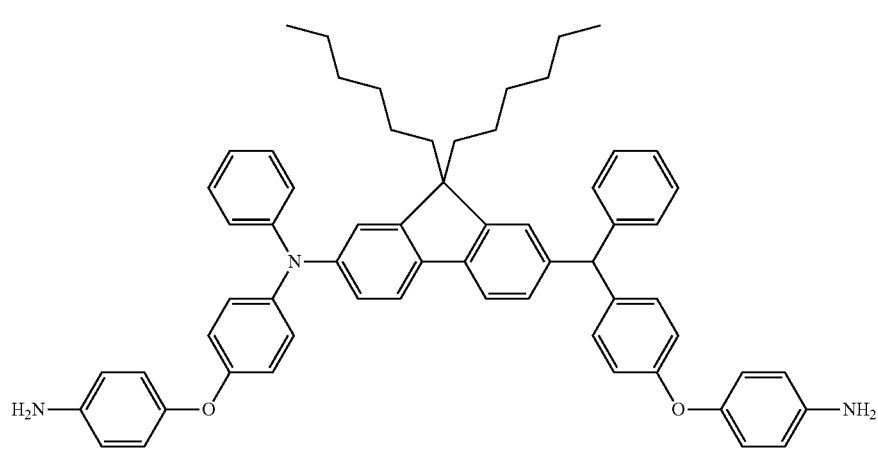

(42)

The solvents used to obtain the charge transporting varnish of the invention include, for example, water, methanol, DMF, DMAc, NMP, N,N'-dimethylimidazolidinone, dimethylsulfoxide, chloroform, toluene and the like although not limited thereto. These solvents may be used singly or in combination of two or more.

A highly viscous solvent may be admixed in the charge transporting varnish of the invention for the purpose of obtaining a highly viscous varnish within a range of amount not impeding the solubility of a charge transporting substance and the like. Specific examples of the highly viscous solvent include cyclohexanol, ethylene glycol, ethylene glycol diglycidyl ether, 1,3-octylene glycol, diethylene glycol, dipropylene glycol, triethylene glycol, tripropylene glycol, 1,3-butanediol, 1,4-butanediol, propylene glycol, hexylene glycol and the like although not limited thereof. Of these, it is preferable to used cyclohexanol or dipropylene glycol from the standpoint that this has an appropriate viscosity and boiling point and exhibits good coating properties on a substrate.

Further, solvents that are capable of imparting flatness of film upon baking for the purposes of improving wettability to substrate, controlling a surface tension of solvent, controlling polarity, and controlling a boiling point may be added within a range of amount not impeding the solubility of a charge transporting substance and the like. Specific examples such a solvent include butyl cellosolve, diethylene glycol diethyl ether, dipropylene glycol monomethyl ether, ethyl carbitol, diacetone alcohol γ-butyrolactone, ethyl lactate and the like although not limited thereto.

The charge transporting thin film according to the invention is formed by use of such a charge transporting varnish as set out hereinabove and can be conveniently used as a hole injection layer or hole transport layer, or an electron injection layer or electron transport layer of an organic EL device.

This thin film can be formed, for example, by coating a charge transporting varnish onto a substrate and evaporating a solved therefrom. The coating manner of the varnish is not critical, and many known coating methods such as a dipping method, a spin coating method, a transfer printing method, a roll coating method, an ink jet method, a spraying method, a brushing method and the like, each ensuring uniform film formation.

The manner of evaporating a solvent is not critical, and evaporation is carried out by use of a hot plate or an oven in an appropriate atmosphere, i.e., in air or in an atmosphere of an inert gas such as nitrogen or the like, or in vacuum, thereby enabling one to obtain a thin film having a uniform film surface. The baking temperature is not limited to any specific one in so far as a solvent can be evaporated and is preferably at 40 to 250° C. In order to develop a more uniform film-forming property or to cause the reaction to proceed on a substrate, the temperature may be changed by two or more stages.

The thickness of the charge transporting thin film is not critical. Where the film is used as a charge injection layer within the organic EL device, the thickness is preferably at 5 to 200 nm. For changing the film thickness, there is used a method wherein a solid concentration in the varnish is changed, or an amount of a solution on a substrate is changed upon coating.

The methods of fabricating an OLED device using the charge transporting varnish (charge transporting thin film) of the invention and the types of materials used are, respectively, those mentioned below although not limited thereto.

The electrode substrate used is cleaned beforehand by subjecting to liquid cleaning with a detergent, an alcohol, pure water or the like, and with an anode substrate, it is preferable to carry out a surface treatment, such as an ozone treatment, an oxygen-plasma treatment or the like, just prior to its use. It will be noted that where an anode material is composed mainly of an organic matter, the surface treatment may not be effected.

Where a hole transporting varnish is used for an OLED device, a thin film is conveniently formed according to the following procedure.

That is, a hole transporting varnish is applied onto an anode substrate by such a coating method as mentioned above to form a hole transporting thin film on the anode. This substrate is introduced into a vacuum deposition apparatus, followed by successive deposition of a hole transporting layer, an emission layer, an electron transporting layer, an electron injection layer and a cathode metal to provide an OLED device. For controlling an emission region, a carrier block layer may be provided between optional layers.

For an anode material, mention is made typically of indium tin oxide (ITO) and indium zinc oxide (IZO). Preferably, a flattened layer is preferable. Additionally, polythiophene derivatives and polyanilines having high charge transportability may also be used.

For materials for forming a hole transporting layer, mention is made, for example, of: triarylamines such as a (triphenylamine)dimmer derivative (TPD), an (α-naphthyldiphenylamine)dimer (α-NPD), [(triphenylamine)dimer]spiro dimer (spiro-TAD) and the like; starburst amines such as 4,4',4"-tris[3-methylphenyl(phenyl)-amino]triphenylamine (m-MTDATA), 4,4',4"-tris[1-naphtyl(phenyl)amino]triphenylamine (1-TNATA) and the like; and oligothiophenes such as 5,5"-bis-{4-[bis(4-methylphenyl)amino]phenyl}-2,2':5', 2"-terthiophene (BMA-3T) and the like.

As materials for forming an emission layer, mention is made, for example, of tris(8-quinolilate)aluminum (III) ($Alq_3$), bis(8-quinolilate)zinc (II)($Znq_2$), bis(2-methyl-8-quinolilate)(p-phenylphenolate)aluminum (III) (BAlq), 4,4'-bis(2,2-diphenylvinyl)biphenyl (DPVBi) and the like. It will be noted that the material for forming such a hole transporting layer as mentioned above or a material for forming an electron transporting layer mentioned hereinbefore and a light-emitting dopant may be co-deposited to form an emission layer. In this case, such a light-emitting dopant includes quinacridone, rubrene, coumarin 540, 4-(dicyanomethylene)-2-methyl-6-(p-dimethylaminostyryl)-4H-pyrane (DCM), tris(2-phenylpyridine)iridium (III) ($Ir(ppy)_3$) and (1,10-phenanthroline)-tris(4,4,4-trifluoro-1-(2-thienyl)-butan-1,3-dionate)europium (III) ($Eu(TTS)_3phen$) and the like.

For materials forming an electron transporting layer, mention is made, for example, of $Alq_3$, BAlq, DPVBi, 2-(4-biphenyl)-5-(4-t-butylphenyl)-1,3,4-oxadiazole (PBD), a triazole derivative (TAZ), bathocuproine (BCP), a silole derivative and the like.

For materials forming an electron injection layer, mention is made, for example, of lithium oxide ($LiO_2$), magnesium oxide (MgO), alumina ($Al_2O_3$), lithium fluoride (LiF), magnesium fluoride ($MgF_2$), strontium fluoride ($SrF_2$), Liq, Li(acac), lithium acetate, lithium benzoate and the like.

The cathode materials include, for example, aluminum, magnesium-silver alloys, aluminum-lithium alloys, lithium, sodium, potassium, cesium and the like.

For materials forming a carrier block layer, mention is made, for example, of PBD, TAZ, BCP and the like.

Where an electron transporting varnish is used for an OLED device, a thin film is conveniently formed according to the following procedure.

That is, an electron transporting varnish is coated onto a cathode substrate by such a coating method as indicated hereinbefore to form an electron transporting thin film on the cathode substrate. This substrate is introduced into a vacuum deposition apparatus, followed by forming an electron transporting layer, an emission layer, a hole transporting layer and a hole injection layer using such materials as set out above, respectively, and forming a film of an anode material by sputtering or the like method to provide an OLED device.

For a method of making a PLED device using a charge transporting varnish of the invention, the following method is mentioned although not limited thereto.

In place of the vacuum deposition operations of the hole transporting layer, emission layer, electron transporting layer and electron injection layer which have been described for carrying out the fabrication of the OLED device, a light-emitting, charge transporting polymer layer is formed to provide a PLED device including a charge transporting thin film obtained from the charge transporting varnish of the invention.

More particularly, a hole transporting thin film is formed on an anode substrate in the same manner as for the OLED device, and a light-emitting, charge transporting polymer layer is formed on top of the thin film, followed by vacuum deposition of a cathode electrode to provide a PLED device.

Alternatively, an electron transporting thin film may be formed on a cathode substrate in the same manner as for the OLED device, on top of which a light-emitting, charge transporting polymer layer formed, followed by formation of an anode electrode by a method such as sputtering, vacuum deposition, spin coating or the like to provide a PLED device.

For the anode and cathode materials used, those exemplified with respect to the OLED device may be likewise used. Cleaning and surface treatments may be carried out in the same manner as illustrated for the OLED device.

The method of forming a light-emitting, charge transporting polymer layer is one wherein a solvent is added to a light-emitting, charge transporting polymer material or a material obtained by adding a light-emitting dopant thereto for dissolution or dispersion, followed by coating onto an electrode substrate which has been formed with a hole injection layer beforehand and evaporating the solvent to from a film.

For the light-emitting, charge transporting polymer materials, mention is made, for example, of polyfluorene derivatives such as a poly(9,9-dialkylfluorene) (PDAF) and the like, polyphenylenevinylene derivatives such as poly(2-methoxy-5-(2'-ethylhexoxy)-1,4-phenylenevinylene) (MEH-PPV) and the like, polythiophene derivatives such as a poly(3-alkylthiophene) (PAT) and the like, polyvinylcarbazole (PVCz) and the like.

The solvent includes toluene, xylene, chloroform or the like. For a dissolution or uniform dispersion method, those methods such as, for example, agitation, heated agitation, ultrasonic dispersion and the like may be mentioned.

The coating method is not critical and includes, for example, a dipping method, a spin coating method, a transfer printing method, a roll coating method, an ink jet method, a spraying method, a brushing method and the like, and coating is preferably carried out in an inert gas such as nitrogen, argon or the like.

For a method of evaporating a solvent, mention is made, for example, of a method of heating in an inert gas or in vacuum with use of an oven or hot plate.

EXAMPLES

Examples and Comparative Examples are illustrated to more particularly describe the invention, which should not be construed as limiting the invention thereto.

It will be noted that in the following Examples and Comparative Examples, the viscosity was measured by means of an E-type viscometer (ELD-50, made by Tokyo Keiki Co., Ltd.) and the molecular weight of polymer was measured by use of a GPC apparatus (SSC-7200, made by Senshu Scientific Co., Ltd.) equipped with a GPC column (KD-803/KD-805, made by Shodex). The film thickness was measured by a surface profile measuring apparatus (DEKTAK3ST, made by Ulvac, Inc.) and the surface roughness was measured by use of an atomic force microscope (AFM) (Nanoscope (registered trade mark) IIIa, made by Veeco Instruments). The device characteristics such as luminance, current density, efficiency and the like were measured by use of an organic EL emission efficiency measuring apparatus (EL-1003, made by Precise Gauges Co., Ltd.) and the measurement of electric conductivity was performed by use of a semiconductor parameter analyzer (4156C, made by Agilent Technologies). For the measurement of transmittance, a visible light-UV absorption spectrum measuring apparatus (UV-3100PC, made by Simadzu Corporation) was used.

Synthetic Example 1

Synthesis of an Oligoaniline Derivative

[Chemical Formula 22]

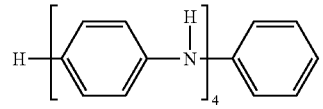

Based on the method described in Bulletin of Chemical Society of Japan, 1994, Vol. 67, pp. 1749 to 1752, phenyltetraaniline (PTA) was obtained according to the following procedure.

First, 12.977 g of p-phenylenediamine was dissolved in 2 liters of toluene, to which 245.05 g of tetra-n-butoxy titanium serving as a dehydration condensation agent was added and dissolved at 70° C. for 30 minutes. Thereafter, 53.346 g of p-hydroxydiphenylamine was added to the solution, followed by reaction at a reaction temperature of 100° C. for 24 hours. After completion of the reaction, the reaction solution was filtered, and the resulting filtrate was washed successively with toluene and dried to obtain silver crystals. Twenty-five parts by weight of dioxane and 0.2 equivalent of hydrazine monohydrate based on the thus obtained crystals were added and the reaction system was purged with nitrogen, after which the crystals were dissolved while heating under reflux.

Twenty-five parts by weight, based on the crystals, of toluene were added to the thus obtained solution to cause the crystals to be suspended, followed by heating under reflux, further addition of 10 parts by weight of dioxane and further heating under reflux to dissolve the crystals. The resulting solution was filtered under heated conditions. The solid matter precipitated from the filtrate was recrystallized, then washed successively with toluene-dioxane (1:1) and ether, and obtained by filtration. The resulting crystals were dried under a reduced pressure at 60° C. for 10 hours. Similar recrystallization operations were repeated once to obtain 39.60 g of white crystals (yield: 75%).

Synthetic Example 2

Polymerization of Polyamic Acid (PI-a)

In a 200 ml four-necked flask, 8.01 g (0.040 mols) of 4,4'-diaminodiphenyl ether (hereinafter abbreviated as DDE) was placed in a stream of nitrogen to be dissolved in 91.9 g of NMP. Thereafter, 8.20 g (0.038 mols) of anhydrous pyromellitic acid (hereinafter abbreviated as PMDA) was added to the solution, followed by polymerization reaction at 23° C. for 2 hours under agitation to obtain a 15% NMP solution of polyamic acid (PI-a) that is a polyimide precursor.

The number average molecular weight (Mn) and weight average molecular weight (Mw) of the thus obtained polyamic acid (PI-a) were, respectively, such that Mn=11500 and Mw=25200.

Synthetic Example 3

Synthesis of Polyamic Acid (PI-b)

In a 200 ml four-necked flask, 8.01 g (0.040 mols) of DDE was placed in a stream of nitrogen to be dissolved in 87.6 g of NMP. Thereafter, 7.45 g (0.038 mols) of 1,2,3,4-cyclobutane-tetracarboxylic acid anhydride (hereinafter abbreviated as CBDA) was added to the solution, followed by polymerization reaction at 23° C. for 5 hours under agitation to obtain a 15% NMP solution of polyamic acid (PI-b). The number average molecular weight (Mn) and weight average molecular weight (Mw) of the thus obtained polyamic acid (PI-b) were, respectively, such that Mn=14000 and Mw=32600.

Example 1

PTA obtained in Synthetic Example 1 and 4 molar equivalents of 5-sulfosalicylic acid (hereinafter abbreviated as 5-SSA) based on PTA were admixed, to which N,N-dimethylacetamide (DMAc) was added in an atmosphere of nitrogen to dissolve them therein. The 15% NMP solution of polyamic acid (PI-a) obtained in Synthetic Example 2 was added to the solution in such a way that the polyamic acid was made at 10 wt % of the total solid content, to which cyclohexanol was added, followed by agitation to prepare varnish (A1) having a solid concentration of 4%.

The thin film formation of the varnish on an ITO glass substrate was carried out in the following manner.

The ITO glass substrate was subjected to ozone cleaning over 40 minutes until just before application of the varnish by spin coating. The above-prepared varnish (A1) was coated onto the ITO glass substrate by a spin coating method and baked in air at 200° C. for 1 hour to provide a 30 nm thick uniform thin film. The electric conductivity of the thus obtained film upon current passage of 100 mA/cm$^2$ was at $3.1 \times 10^{-7}$ Scm$^{-1}$.

Example 2

PTA obtained in Synthetic Example 1 and 4 molar equivalents of 5-SSA based on PTA were admixed, to which N,N-dimethylacetamide (DMAc) was added in an atmosphere of nitrogen to dissolve them therein. The 15% NMP solution of polyamic acid (PI-a) obtained in Synthetic Example 2 was added to the solution in such a way that the polyamic acid was made at 3 wt %, 15 wt % and 20 wt % of the total solid content, to which cyclohexanol was added, followed by agitation to prepare varnishes (A2), (A3) and (A4) having a solid concentration of 4%.

Individual varnishes thus obtained were coated onto an ITO glass substrate according to the method described in Example 1 and baked in air at 200° C. for 1 hour to provide 30 nm thick uniform thin films. The electric conductivities of the thus obtained thin films upon current passage of 100 mA/cm$^2$ were, respectively, at $4.0 \times 10^{-7}$ Scm$^{-1}$, $3.6 \times 10^{-7}$ Scm$^{-1}$ and $1.3 \times 10^{-7}$ Scm$^{-1}$.

Example 3

PTA obtained in Synthetic Example 1 and 4 molar equivalents of 5-SSA based on PTA were admixed, to which N,N-dimethylacetamide (DMAc) was added in an atmosphere of nitrogen to dissolve them therein. The 15% NMP solution of polyamic acid (PI-b) obtained in Synthetic Example 3 was added to the solution in such a way that the polyamic acid was made at 10 wt % and 15 wt % of the total solid content, to which cyclohexanol was added, followed by agitation to prepare varnishes (B1) and (B2) having a solid concentration of 4%. Individual varnishes thus obtained were coated onto an ITO glass substrate according to the method described in Example 1 and baked in air at 200° C. for 1 hour to provide 30 nm thick uniform thin films. The electric conductivities of the thus obtained thin films upon current passage of 100 mA/cm$^2$ were, respectively, at $3.8 \times 10^{-7}$ Scm$^{-1}$ and $3.2 \times 10^{-7}$ Scm$^{-1}$.

Comparative Example 1

PTA obtained in Synthetic Example 1 and 4 molar equivalents of 5-SSA based on PTA were admixed, to which N,N-dimethylacetamide (DMAc) was added in an atmosphere of nitrogen to dissolve them therein, to which cyclohexanol was added, followed by agitation to prepare a varnish (C) having a solid concentration of 4%.

The thus obtained varnish (C) was coated onto an ITO glass substrate according to the method described in Example 1 and baked in air at 200° C. for 1 hour to provide 30 nm thick uniform thin films. The electric conductivity of the thus obtained thin film upon current passage of 100 mA/cm$^2$ was at $3.6 \times 10^{-7}$ Scm$^{-1}$.

From the above results, it will be seen that the thin films obtained in Examples 1 to 3 have a conductivity approximately same as the thin film of Comparative Example 1.

Comparative Example 2

To 200 mg of the leucoemeraldine form of polyaniline (made by Aldrich & Company, molecular weight Mw=about 20,000), 479 mg of 5-SSA was added, to which 19.32 g of dimethylacetamide was added in an atmosphere of nitrogen to dissolve them therein. The 15% NMP solution of polyamic acid (PI-a) obtained in Synthetic Example 2 was added to the solution in such a way that the polyamic acid was made at 10 wt % of the total solid content to prepare varnish (D) having a solid content of 1%. This was coated onto an ITO glass substrate according the method described in Example 1, but a uniform film could not be obtained.

Example 4

The varnishes obtained in Examples 1 to 3 were, respectively, formed as a hole transporting thin film on an ITO glass substrate according to the method described in Example 1, followed by introduction within a vacuum deposition apparatus and successive deposition of α-NPD, Alq$_3$, LiF and Al. The film thicknesses were, respectively, at 40 nm, 60 nm, 0.5 nm and 100 nm, and vacuum deposition operations were started for each case when a pressure reached $8 \times 10^{-4}$ Pa or below. The deposition rate was set at 0.3 to 0.4 nm/s except for LiF and that of LiF was set at 0.02 to 0.04 nm/s. The moving operation between the deposition operation cycles was performed in vacuum. The characteristics of the resulting OLED devices are shown in Table 1.

Comparative Example 3

The varnish (C) obtained in Comparative Example 1 was coated as a hole transporting thin film on an ITO glass substrate according to the method described in Example 1, followed by introduction of a vacuum deposition apparatus and successive deposition of α-NPD, Alq$_3$, LiF and Al. The respective film thicknesses were at 40 nm, 60 nm, 0.5 nm and 100 nm, and the deposition operation was carried out after the pressure arrived at 8×10$^{-4}$ Pa or below and the deposition rate was at 0.3 to 0.4 nm/s except for LiF and at 0.02 to 0.04 nm/s for LiF. The moving operation between the vacuum deposition cycles was performed in vacuum. The characteristics of the resulting OLED device are shown in Table 1.

TABLE 1

| | Varnish | Ratio of polyimide (wt %) | Emission initiating voltage (V) | On passage of an electric current of 50 mA/cm$^2$ | | |
|---|---|---|---|---|---|---|
| | | | | Voltage (V) | Luminance (cd/cm$^2$) | Current efficiency (cd/A) |
| Example 4 | A2 | 3 | 2.8 | 8.3 | 2790 | 5.6 |
| | A1 | 10 | 3.0 | 8.6 | 3320 | 6.6 |
| | A3 | 15 | 3.0 | 8.9 | 2760 | 5.5 |
| | A4 | 20 | 3.3 | 9.4 | 2600 | 5.3 |
| | B1 | 10 | 2.8 | 8.9 | 3100 | 6.2 |
| | B2 | 15 | 2.8 | 8.9 | 2800 | 5.6 |
| Comparative Example 3 | C | 0 | 3.3 | 9.7 | 2500 | 5.0 |

As shown in Table 1, it will be seen that the OLED devices of Example 4 provided, as a hole transporting thin film, with the thin films obtained from the respective varnishes prepared in Examples 1 to 3 are lower in emission initiating voltage and higher in efficiency than the OLED device of Comparative example 3 provided, as a hole transporting thin film, with the thin film obtained from the varnish prepared in Comparative Example 1.

Example 5

The varnishes (A1) and (A3) obtained in Examples 1 and 2 were coated, according to a spin coating method, on a quartz substrate that had been subjected to ozone cleaning for 40 minutes until just before the spin coating and baked in air at 200° C. for 1 hour to provide a 30 nm thick uniform thin film. The resulting substrate was subjected to measurement of a transmittance by use of a UV-visible absorption spectrum (UV/VIS spectrum) apparatus. The resulting transmittance spectrum is shown in FIG. 1.

Example 6

The varnishes (B1) and (B2) obtained in Example 3 were coated, by spin coating, on a quartz substrate that had been subjected to ozone cleaning over 40 minutes until just before the spin coating and baked in air at 200° C. for 1 hour to provide a 30 nm thick uniform thin film. The resulting substrate was subjected to measurement of transmittance by use of a visible-UV absorption spectrum (UV/VIS spectrum) apparatus. The resulting transmission spectrum is shown in FIG. 2.

Comparative Example 4

The varnish (C) obtained in Comparative Example 1 was coated onto a quartz substrate according to the method described in Example 5 and baked in air at 200° C. for 1 hour to provide a 30 nm thick uniform thin film. The resulting substrate was subjected to measurement of transmittance by use of a visible-UV absorption spectrum (UV/VIS spectrum) apparatus. The resulting transmission spectrum is shown in FIG. 3.

Figure 2:
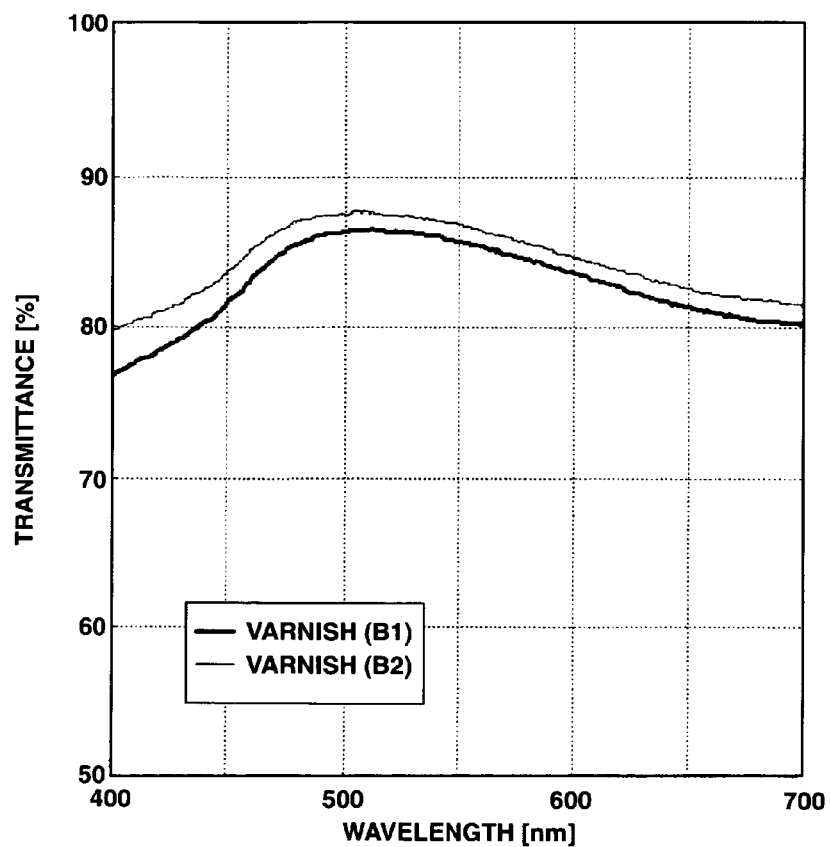
FIG. 2 is a transmission spectrum, at 400 nm to 700 nm, of each of thin films formed by coating and baking varnishes (B1) and (B2) on a quartz substrate.
Figure 3:
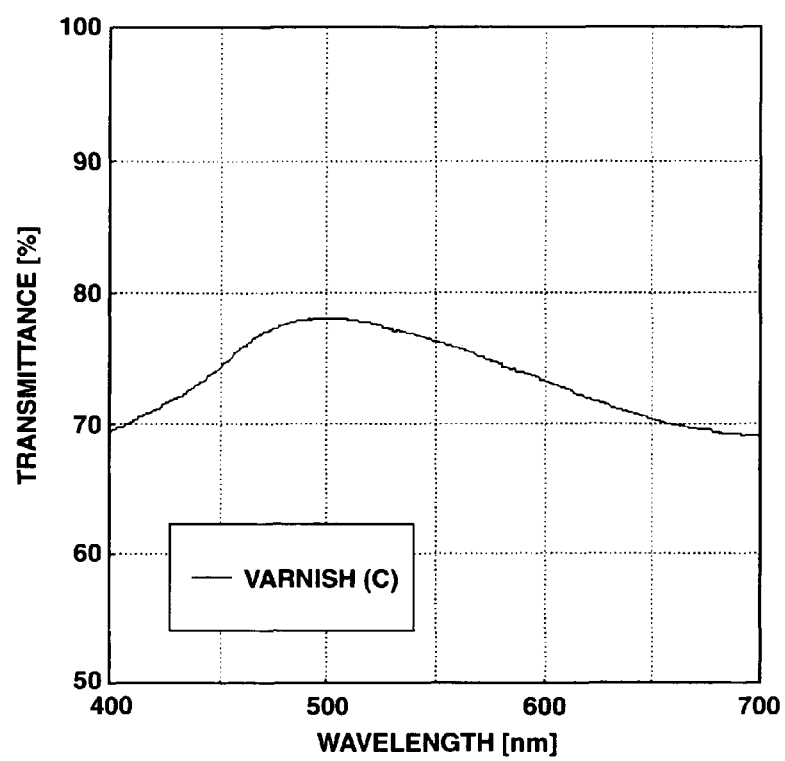
FIG. 3 is a transmission spectrum, at 400 nm to 700 nm, of a thin film formed by coating and baking a varnish (C) on a quartz substrate.

As shown in FIGS. 1 to 3, it will be seen that the transmittances of the thin film obtained from the varnishes (A1), (A3), (B1) and (B2) are higher than that of the thin film obtained in the varnish (C) of Comparative Example 1.

Synthetic Example 4

Polymerization of Polyamic Acid (PI-x1)

In a 100 ml four-necked flask, 3.37 g (4.8 mmols) of N,N'-diphenyl-N,N'-di(4-(aminophenoxy)phenyl)benzidine (hereinafter abbreviated as TPD-DA) and 0.13 g (1.2 mmols) of p-phenylenediamine were placed in a stream of nitrogen and dissolved in 11.4 g of NMP, followed by further addition of 1.15 g (5.9 mmols) of CBDA suspended in 15.0 g of NMP. The mixture was agitated at 23° C. for 6 hours for polymerization reaction to obtain a 15% NMP solution of polyamic acid (PI-x1) that was a polyimide precursor. The number average molecular weight (Mn) and the weight average molecular weight (Mw) of the resulting polyamic acid (PI-x1) were, respectively, such that Mn=32700 and Mw=76800.

Synthetic Example 5

Polymerization of Polyamic Acid (PI-x2)

In a 100 ml four-necked flask, 2.46 g (3.5 mmols) of TPD-DA and 0.38 g (3.5 mmols) of p-phenylenediamine were placed in a stream of nitrogen and dissolved in 10.5 g of NMP, followed by further addition of 1.33 g (6.8 mmols) of CBDA suspended in 27.2 g of NMP. The mixture was agitated at 23° C. for 6 hours for polymerization reaction to obtain a 10% NMP solution of polyamic acid (PI-x2) that was a polyimide precursor. The number average molecular weight (Mn) and the weight average molecular weight (Mw) of the resulting polyamic acid (PI-x2) were, respectively, such that Mn=34700 and Mw=79400.

Synthetic Example 6

Polymerization of Polyamic Acid (PI-x3)

In a 100 ml four-necked flask, 1.69 g (2.4 mmols) of TPD-DA and 1.03 g (9.6 mmols) of p-phenylenediamine were placed in a stream of nitrogen and dissolved in 12.0 g of NMP, followed by further addition of 2.26 g (11.5 mmols) of CBDA suspended in 32.8 g of NMP. The mixture was agitated at 23° C. for 6 hours for polymerization reaction to obtain a 10% NMP solution of polyamic acid (PI-x3) that was a polyimide precursor. The number average molecular weight (Mn) and the weight average molecular weight (Mw) of the resulting polyamic acid (PI-x3) were, respectively, such that Mn=53000 and Mw=122000.

It will be noted that TPD-DA used in the above Synthetic Examples 4 to 6 and represented by the following formula was synthesized according to a procedure set out in WO 02/100949.

[Chemical Formula 23]

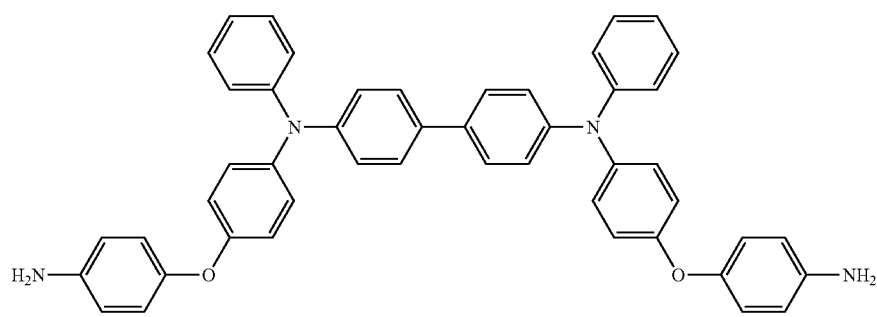

Example 7

Eight molar equivalents, based on PTA, of 5-SSA was added to PTA obtained in Synthetic Example 1, and was dissolved in N,N-dimethylacetamide (DMAc) by addition thereof in an atmosphere of nitrogen. Thereafter, a 15% NMP solution of polyamic acid (PI-x1) obtained in Synthetic Example 4 were added to the solution in such a way that the polyamic acid was made at 10 wt % of the total solid content, followed by further addition of cyclohexanol and agitation to prepare varnish (X1) having a solid content of 5%.

The thus obtained varnish was formed as a thin film on an ITO glass substrate according to the following procedure. The varnish (X1) was coated, according to a spin coating method, onto an ITO glass substrate that had been subjected to ozone cleaning over 40 minutes until just before spin coating of the varnish, followed by baking in air at 200° C. for 1 hour to provide a 30 nm thick uniform thin film. The electric conductivity of the thin film upon passage of an electric current of 100 mA/cm² was found to be $4.8 \times 10^{-7}$ Scm$^{-1}$.

Example 8

The 10% NMP solution of polyamic acid (PI-x2) obtained in Synthetic Example 5 were added to such a DMAc solution of PTA/5-SSA as prepared in the method described in Example 7 in such a way that the polyamic acid was made at 10 wt % of the total solid content, followed by further addition of cyclohexanol and agitation to prepare varnish (X2) having a solid content of 5%. The thus obtained varnish was coated onto an ITO substrate in the same manner as in Example 7 and baked in air at 200° C. for 1 hour to provide a 30 nm thick uniform thin film. The electric conductivity of the thin film upon passage of an electric current of 100 mA/cm² was found to be $4.0 \times 10^{-7}$ Scm$^{-1}$.

Example 9

In the same manner as in Example 8 except that the polyamic acid (PI-x3) obtained in Synthetic Example 6 was used, varnish (X3) having a solid concentration of 5% was prepared. The thus obtained varnish was coated onto an ITO substrate in the same manner as in Example 7 and baked in air at 200° C. for 1 hour to provide a 30 nm thick uniform thin film. The electric conductivity of the thin film upon passage of an electric current of 100 mA/cm² was found to be $4.0 \times 10^{-7}$ Scm$^{-1}$.

Example 10

In the same manner as in Example 7 except that the polyamic acid (PI-b) obtained in Synthetic Example 3 was used, varnish (X4) having a solid concentration of 5% was prepared. The thus obtained varnish was coated onto an ITO substrate in the same manner as in Example 7 and baked in air at 200° C. for 1 hour to provide a 30 nm thick uniform thin film. The electric conductivity of the thin film upon passage of an electric current of 100 mA/cm² was found to be $5.2 \times 10^{-7}$ Scm$^{-1}$.

Comparative Example 5

Cyclohexanol was added to such a DMAc solution of PTA-SSA as prepared by the method described in Example 7 and agitated to prepare varnish (Z) having a solid content of 5%. The thus obtained varnish (Z) was coated onto an ITO substrate in the same manner as in Example 7 and baked in air at 200° C. for 1 hour to provide a 30 nm thick uniform thin film. The electric conductivity of the thin film upon passage of an electric current of 100 mA/cm² was found to be $6.8 \times 10^{-7}$ Scm$^{-1}$.

Example 11

The varnishes (X1-X4) obtained in Examples 7 to 10 were, respectively, formed as a hole transporting thin film on an ITO glass substrate according to the method described in Example 7, followed by introduction into a vacuum deposition apparatus and successive deposition of α-NPD, Alq$_3$, LiF and Al. The film thicknesses were set at 40 nm, 45 nm, 0.5 nm and 100 nm, respectively, and each deposition operation was started after the pressure was arrived at $8 \times 10^{-4}$ Pa or below, and the deposition rate was set at 0.3 to 0.4 nm/s except for LiF and at 0.02 to 0.4 nm/s for LiF. The moving operation between deposition cycles was carried out in vacuum. The characteristics of the resulting OLED device are shown in Table 2.

Comparative Example 6

The varnish (Z) obtained in Comparative Example 5 was formed as a hole transporting thin film on an ITO glass substrate according to the method described in Example 7, followed by vacuum deposition in the same manner as in Example 11 to provide an OLED device. The characteristics of the resulting OLED device are shown in Table 2.

TABLE 2

|  |  | Poly-imide species | Emission initiating voltage (V) | On passage of an electric current of 50 mA/cm² | | |
|---|---|---|---|---|---|---|
|  | Varnish |  |  | Voltage (V) | Luminance (cd/cm²) | Current efficiency (cd/A) |
| Example 11 | X1 | PI-x1 | 2.8 | 8.1 | 1670 | 1.3 |
|  | X2 | PI-x2 | 2.8 | 7.7 | 1630 | 1.3 |
|  | X3 | PI-x3 | 2.8 | 7.5 | 1600 | 1.3 |
|  | X4 | PI-b | 3.0 | 8.5 | 1710 | 1.3 |
| Comparative Example 6 | Z | nil | 3.0 | 8.9 | 1380 | 1.0 |

\* The respective polyamic acids were contained in an amount of 10 wt % based on the total solid content of varnish.

As shown in Table 2, the respective OLED devices of Example 11 provided with the films prepared from the varnishes (X1 to X4) using the polyamic acids are lower in emission initiating voltage and drive voltage and higher in efficiency than the device of Comparative Example 6 provided with the film prepared from the polyamic acid-free varnish (Z). It will also be seen that the devices provided with the films prepared from the varnishes (X1 to X3) which make use of polyamic acids having a triarylamine skeleton are lower in emission initiating voltage and drive voltage than the device provided with the film prepared from the varnish (X4) using the triarylamine skeleton-free polyamic acid.

Example 12

The 10% NMP solution of the polyamic acid (PI-x3) obtained in Synthetic Example 6 was added to the DMAc solution of PTA/5-SSA prepared according to the method described in Example 7 in such a way that polyamic acid was made at 20 wt % and 30 wt % of the total solid content, followed by further addition of cyclohexanol and agitation to prepare varnishes (X5, X6) having a solid content of 5%.

Example 13

The respective varnishes (X3, X5, X6) obtained in Examples 9 and 12 were formed as a hole transporting thin film on an ITO glass substrate in the same manner as in Example 7, followed by introduction into a vacuum deposition apparatus and successive deposition of α-NPD, Alq$_3$, LiF and Al. The film thicknesses were set at 30 nm, 40 nm, 0.5 nm and 100 nm, respectively, and each deposition operation was started after the pressure arrived at $8\times10^{-4}$ Pa or below, and the deposition rate was set at 0.3 to 0.4 nm/s except for LiF and at 0.02 to 0.4 nm/s for LiF. The moving operation between deposition cycles was carried out in vacuum. The characteristics of the resulting OLED device are shown in Table 3.

Comparative Example 7

The varnish (Z) obtained in Comparative Example 5 were formed as a hole transporting thin film on an ITO glass substrate in the same manner as in Example 7, followed by vacuum deposition in the same manner as in Example 13 to provide an OLED device. The characteristics of the OLED device are shown in Table 3.

TABLE 3

|  | Varnish | Ratio of polyimide (wt %) | Polyimide species | Emission initiating voltage (V) | On passage of an electric current of 50 mA/cm² | | |
|---|---|---|---|---|---|---|---|
|  |  |  |  |  | Voltage (V) | Luminance (cd/m²) | Current efficiency (lm/W) |
| Example 13 | X3 | 10 | PI-x3 | 2.8 | 6.8 | 2440 | 2.2 |
|  | X5 | 20 | PI-x3 | 2.8 | 7.3 | 2060 | 1.8 |
|  | X6 | 30 | PI-x3 | 2.8 | 7.4 | 1880 | 1.6 |
| Comparative Example 7 | Z | 0 | nil | 2.8 | 7.7 | 2150 | 1.7 |

As shown in Table 3, the respective OLED devices of Example 13 provided with the films prepared from the varnishes (X3, X5 and X6) are lower in drive voltage than the device of Comparative Example 7 provided with the film prepared from the varnish (Z).

It will also be seen that the respective OLED devices provided with the films prepared from the varnishes (X3, X5) are higher in efficiency than the device of (Z).

The invention claimed is:

1. A charge transporting varnish comprising:
    a charge transporting substance comprising a charge transporting oligoaniline having a number average molecular weight of 250 to below 800 or a charge transporting organic material comprising the charge transporting substance and a charge transporting dopant substance, and at least one polymer selected from polyimides and polyimide precursors, the charge transporting substance or charge transporting organic material, and the polymer being dissolved or dispersed in at least one solvent,
    wherein the charge transporting substance is made of an oligoaniline derivative represented by the general formula (1) or a quinonediimine derivative that is an oxidized product of the general formula (1)

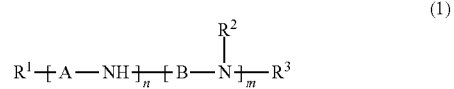

(1)

wherein R$^1$ and R$^2$ independently represent hydrogen, a monovalent hydrocarbon group or an organoxy group, R$^3$ represents a phenyl group, A and B independently represent a divalent group represented by the general formula (2) or (3)

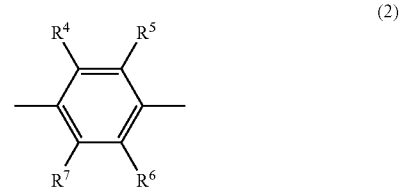

(2)

(3)

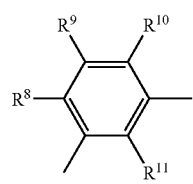

wherein R⁴ to R¹¹ independently represent hydrogen, a hydroxyl group, a monovalent hydrocarbon group, an organoxy group, an acyl group or a sulfone group, and m and n are independently an integer of 1 or over, and is such that m+n≤20 is satisfied, wherein the polymer is made of a polyimide precursor represented by the general formula (5), or a polyimide obtained by dehydration ring closure of the polyimide precursor (5)

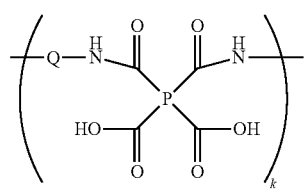

wherein P is at least one tetravalent organic group selected from those of the general formulas (6) to (12)

(6)

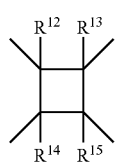

(7)

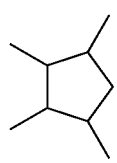

(8)

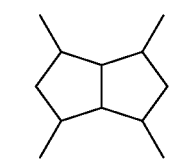

(9)

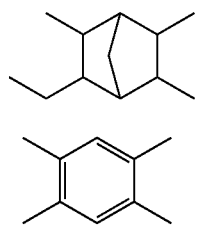

(10)

(11)

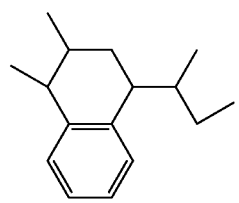

(12)

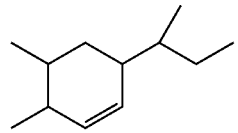

in the formula (6), $R^{12}$ to $R^{15}$ independently represent hydrogen, fluorine, an alkyl group that has 1 to 5 carbon atoms and may have a branched structure, or an alkoxy group that has 1 to 5 carbon atoms and may have a branched structure, Q is at least one divalent organic group selected from those of the general formulas (13) to (19)

(13)

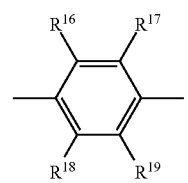

(14)

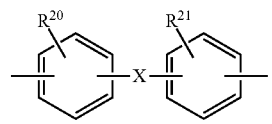

(15)

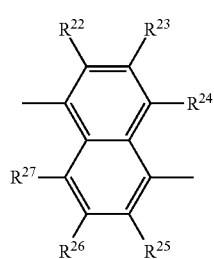

(16)

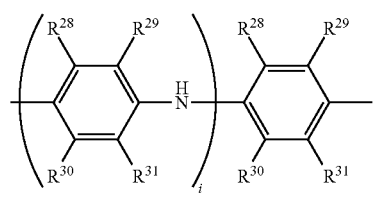

(17)

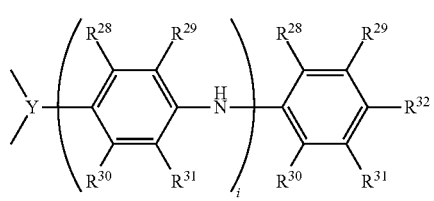

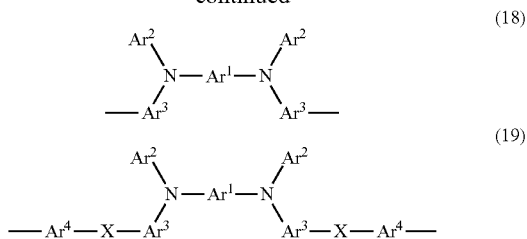

(18)

(19)

wherein $R^{16}$ to $R^{32}$ independently represent hydrogen, fluorine, an alkyl group that has 1 to 5 carbon atoms and may have a branched structure, or an alkoxy group that has 1 to 5 carbon atoms and may have a branched structure, X independently represents —O—, —S—, —C(O)NH—, —NHC(O)—, an alkylene group that has 1 to 5 carbon atoms and may have a branched structure, or an alkylenedioxo group that has 1 to 5 carbon atoms and may have a branched structure, Y represents a group of the general formula (20)

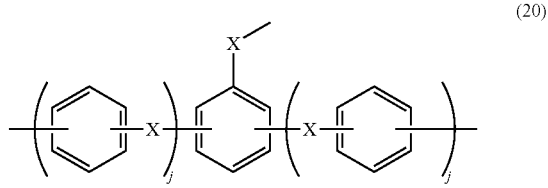

(20)

wherein X has the same meaning as defined above, and j is 0 or 1, $Ar^1$, $Ar^3$ and $Ar^4$ independently represent a divalent benzene ring that may be substituted with W, a divalent naphthalene ring that may be substituted with W, a divalent biphenyl group that may be substituted with W, a divalent terphenyl group that may be substituted with W or a divalent fluorene group that may be substituted with W, $Ar^2$ represents a phenyl group that may be substituted with W, a naphthyl group that may be substituted with W, a biphenyl group that may be substituted with W, a terphenyl group that may be substituted with W or a fluorene group that may be substituted with W, W represents fluorine, an alkyl group that has 1 to 8 carbon atoms and may have a branched structure or an alkoxy group that has 1 to 8 carbon atoms and may have a branched structure, and i is an integer of 1 to 4 and k is a positive integer.

2. The charge transporting varnish according to claim 1, wherein the charge transporting substance is made of an oligoaniline derivative represented by the general formula (4) or a quinonediimine derivative that is an oxidized product of the general formula (4)

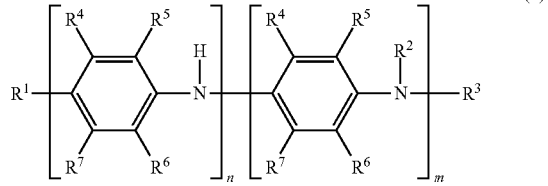

(4)

wherein $R^1$ to $R^7$, m and n, respectively, have the same meanings as defined above.

3. The charge transporting varnish according to claim 2, wherein m and n is such that m+n≤6 is satisfied.

4. The charge transporting varnish according to any one of claims 1 and 2 to 3, wherein the polymer is contained in 0.1 to 50 wt % based on the total weight of solids in the charge transporting varnish.

5. The charge transporting varnish according to claim 1, wherein the polymer is made of a polyimide or polyimide precursor having a number average molecular weight of 1000 to 50000.

6. The charge transporting varnish according to claim 5, wherein the polymer is made of a polyimide precursor represented by the general formula (21) or a polyimide obtained by hydration ring closure of the polyimide precursor

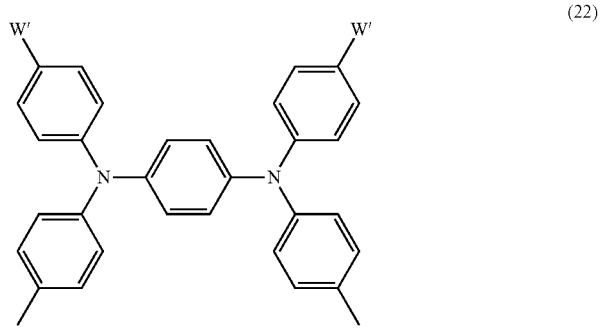

(21)

wherein P and Q, respectively, have the same meanings as defined above, Z is at least one divalent organic group selected from the general formula (18) or (19), $u^1$ and $u^2$ are independently an integer of 1 or over, and is such that $u^1/(u^1+u^2) \geq 0.2$ is satisfied.

7. The charge transporting varnish according to claim 6, wherein the Z is at least one divalent organic group selected from those of the general formulas (22) to (27)

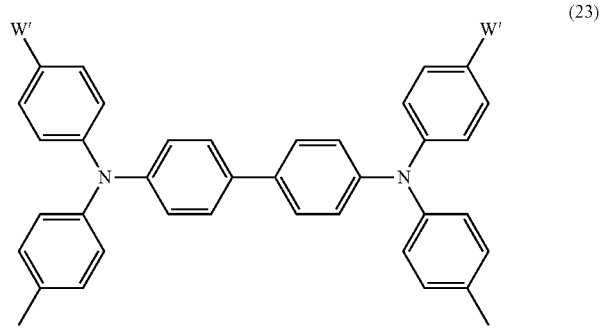

(22) (23)

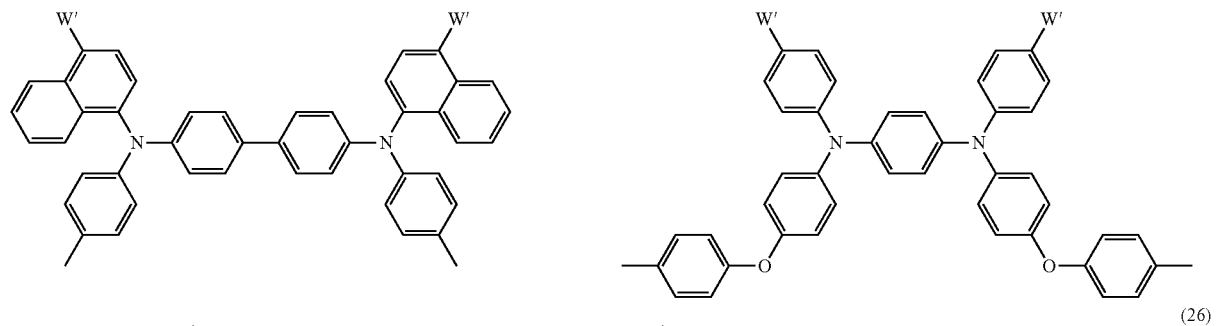

(24)

(25)

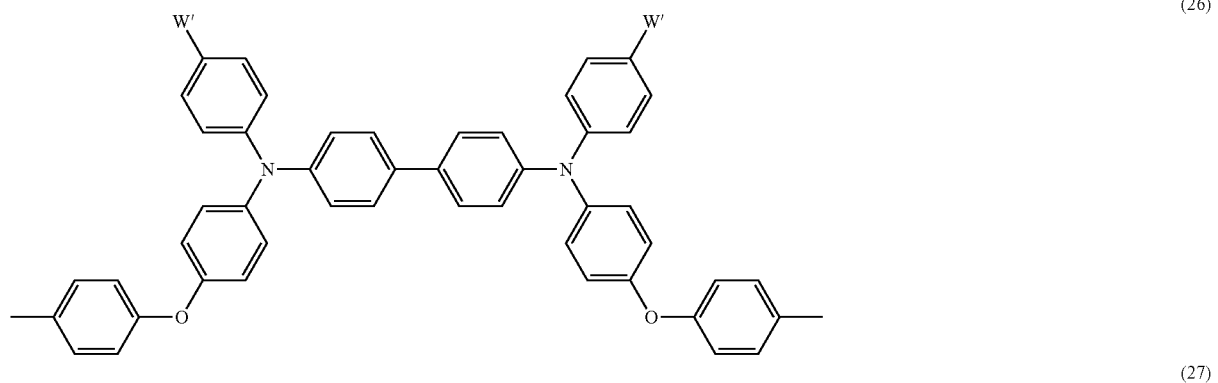

(26)

(27)

wherein W' represents a hydrogen atom, fluorine, an alkyl group that has 1 to 8 carbon atoms and may have a branched structure or an alkoxy group that has 1 to 8 carbon atoms and may have a branched structure.

8. The charge transporting thin film formed by use of the charge transporting varnish defined in claim 1.

9. The organic electroluminescent device comprising at least one layer made of the charge transporting thin film of claim 8.

10. The charge transporting varnish according to claim 1, wherein the charge transporting oligoaniline has no distribution of molecular weight.

* * * * *